(12) United States Patent
Abdo

(10) Patent No.: US 10,707,812 B2
(45) Date of Patent: Jul. 7, 2020

(54) SUPERCONDUCTING DEVICE THAT MIXES SURFACE ACOUSTIC WAVES AND MICROWAVE SIGNALS

(71) Applicant: International Business Machines Corporation, Armonk, NY (US)

(72) Inventor: Baleegh Abdo, Fishkill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/048,992

(22) Filed: Jul. 30, 2018

(65) Prior Publication Data
US 2020/0036331 A1    Jan. 30, 2020

(51) Int. Cl.
| | |
|---|---|
| *H03H 9/25* | (2006.01) |
| *H03D 7/00* | (2006.01) |
| *G06N 10/00* | (2019.01) |
| *H01L 39/02* | (2006.01) |
| *H01L 39/12* | (2006.01) |
| *H01L 39/22* | (2006.01) |
| *H01L 39/24* | (2006.01) |

(Continued)

(52) U.S. Cl.
CPC ............ *H03D 7/005* (2013.01); *G06N 10/00* (2019.01); *H01L 39/025* (2013.01); *H01L 39/12* (2013.01); *H01L 39/223* (2013.01); *H01L 39/2493* (2013.01); *H03F 19/00* (2013.01); *H03H 3/08* (2013.01); *H03H 9/02637* (2013.01); *H03H 9/24* (2013.01); *H03H 9/25* (2013.01); *H03F 2200/451* (2013.01)

(58) Field of Classification Search
CPC ....................................................... H03D 7/005
See application file for complete search history.

(56) References Cited

U.S. PATENT DOCUMENTS

| | | |
|---|---|---|
| 5,837,332 A | 11/1998 | Takahashi et al. |
| 6,005,446 A | 12/1999 | Galani et al. |
| | (Continued) | |

FOREIGN PATENT DOCUMENTS

| | | |
|---|---|---|
| EP | 1035648 A2 | 9/2000 |
| WO | 2008006089 A2 | 1/2008 |
| | (Continued) | |

OTHER PUBLICATIONS

Frattini et al., "3-wave mixing Josephson dipole element," Applied Physics Letters, 2017, vol. 110, Issue 22, ID 222603, American Institute of Physics, 5 pages.

(Continued)

*Primary Examiner* — Hai L Nguyen
(74) *Attorney, Agent, or Firm* — Amin, Turocy & Watson, LLP

(57) ABSTRACT

A superconducting device that mixes surface acoustic waves and microwave signals and techniques for fabricating the same are provided. A superconducting device can comprise a superconducting surface acoustic wave resonator and a superconducting microwave resonator. The superconducting device can also comprise a Josephson ring modulator coupled to the superconducting surface acoustic wave resonator and the superconducting microwave resonator. The Josephson ring modulator can be a dispersive nonlinear three-wave mixing element.

19 Claims, 10 Drawing Sheets

(51) Int. Cl.
*H03F 19/00* (2006.01)
*H03H 3/08* (2006.01)
*H03H 9/02* (2006.01)
*H03H 9/24* (2006.01)

(56) References Cited

U.S. PATENT DOCUMENTS

| | | | |
|---|---|---|---|
| 6,563,310 B2 | 5/2003 | Zagoskin | |
| 6,797,338 B2 | 9/2004 | Saitoh et al. | |
| 6,900,454 B2 | 5/2005 | Blais et al. | |
| 7,724,083 B2 | 5/2010 | Herring et al. | |
| 7,932,514 B2 | 4/2011 | Farinelli et al. | |
| 8,111,083 B1 | 2/2012 | Pesetski et al. | |
| 8,508,280 B2 | 8/2013 | Naaman et al. | |
| 8,878,626 B2 | 11/2014 | Zmuidzinas et al. | |
| 8,954,125 B2 | 2/2015 | Corcoles Gonzalez et al. | |
| 9,153,764 B2 | 10/2015 | Colli | |
| 9,260,289 B2 | 2/2016 | Park | |
| 9,350,460 B2 | 5/2016 | Paik | |
| 9,379,303 B2 | 6/2016 | Gambetta et al. | |
| 9,461,588 B1 | 10/2016 | Naaman et al. | |
| 9,548,742 B1 | 1/2017 | Abdo | |
| 9,627,045 B1 | 4/2017 | Mukhanov et al. | |
| 9,680,452 B1 | 6/2017 | Abdo | |
| 9,697,473 B2 | 7/2017 | Abdo | |
| 9,768,771 B2 | 9/2017 | Naaman | |
| 9,806,711 B1 | 10/2017 | Abdo | |
| 9,843,312 B2 | 12/2017 | Abdo | |
| 9,858,532 B2 | 1/2018 | Abdo | |
| 9,906,206 B2 | 2/2018 | Shih et al. | |
| 9,948,254 B2 | 4/2018 | Narla et al. | |
| 10,014,859 B2 | 7/2018 | Abdo | |
| 10,062,829 B1 | 8/2018 | Abdo | |
| 10,068,184 B1 | 9/2018 | Hertzberg et al. | |
| 10,074,793 B2 | 9/2018 | Abdo | |
| 10,097,143 B2 | 10/2018 | Abdo | |
| 10,103,730 B1 | 10/2018 | Abdo | |
| 10,236,432 B2 * | 3/2019 | Abdo | H03D 7/005 |
| 10,320,331 B1 | 6/2019 | Abdo | |
| 10,348,245 B1 | 7/2019 | Abdo | |
| 10,396,782 B2 * | 8/2019 | Abdo | H01P 1/18 |
| 2002/0036549 A1 | 3/2002 | Matsuda et al. | |
| 2016/0308502 A1 | 10/2016 | Abdo et al. | |
| 2017/0091648 A1 | 3/2017 | Abdo | |
| 2017/0104695 A1 | 4/2017 | Naaman | |
| 2017/0199036 A1 | 7/2017 | Moxley, III | |
| 2017/0229633 A1 | 8/2017 | Abdo | |
| 2017/0250673 A1 | 8/2017 | Ruby et al. | |
| 2018/0069288 A1 | 3/2018 | Minev et al. | |
| 2018/0113373 A1 | 4/2018 | Witmer et al. | |
| 2019/0013458 A1 | 1/2019 | Hill et al. | |

FOREIGN PATENT DOCUMENTS

| | | |
|---|---|---|
| WO | 2016138406 A1 | 9/2016 |
| WO | 2016168642 A1 | 10/2016 |

OTHER PUBLICATIONS

Noguchi et al., "Qubit-assisted transduction for a detection of surface acoustic waves near the quantum limit," Oct. 2017, arXiv:1710.00467v1, 10 pages.

Moores et al., "Cavity quantum acoustic device in the multimode strong coupling regime," Nov. 2017, arXiv:1711.05913v1, Joint Institute for Laboratory Astrophysics, National Institute of Standards and Technology and the University of Colorado, 12 pages.

Magnusson et al., "Quantum Surface Acoustics," Applied Physics Letters, 2015, vol. 106, Issue 6, ID 063509, 4 pages.

Ekstrom et al., "Surface acoustic wave unidirectional transducers for quantum applications," Applied Physics Letters, 2017, vol. 110, ID 073105, AIP Publishing, 4 pages.

Gustafsson et al., "Propagating phonons coupled to an artificial atom," Science, Oct. 2014, vol. 346, Issue 6206, pp. 207-211, 6 pages.

Bolgar et al., "Experimental demonstration of a two-dimensional phonon cavity in the quantum regime," 2017, arxiv:1710.06476, 7 pages.

Abdo et al., "Nondegenerate three-wave mixing with the Josephson ring modulator," Physical Review B, 2013, vol. 87, ID 014508, American Physical Society, 18 pages.

Abdo et al., "Josephson amplifier for qubit readout," Applied Physics Letters, 2011, vol. 99, ID 162506, American Institute of Physics, 4 pages.

Pillet et al., "A compact design for the Josephson mixer: The lumped element circuit," Applied Physics Letters, Jun. 2015, vol. 106, ID 222603, AIP Publishing, 7 pages.

Bergeal et al., "Phase preserving amplification near the quantum limit with a Josephson Ring Modulator," Dec. 2009, arXiv:0912.3407v1, 20 pages.

Bergeal et al., "Analog information processing at the quantum limit with a Josephson ring modulator," Nature Physics, Feb. 2010, Macmillan Publishers Limited, 7 pages.

Gu et al., "Microwave photonics with superconducting quantum circuits," Oct. 2017, arXiv:1707.02046v2, 170 pages. https://arxiv.org/pdf/1707.02046.pdf.

Abdo et al.,"Directional Amplification with a Josephson Circuit," Physical Review X, 2013, vol. 3, Issue 3, ID 031001, American Physical Society, 8 pages.

Notice of Allowance received for U.S. Appl. No. 16/049,006 dated Feb. 28, 2019, 25 pages.

Notice of Allowance received for U.S. Appl. No. 16/048,979 dated Jan. 24, 2019, 26 pages.

International Search Report and Written Opinion for International Application Serial No. PCT/EP2019/070103 dated Oct. 29, 2019, 15 pages.

International Search Report and Written Opinion for International Application Serial No. PCT/EP2019/070090 dated Feb. 6, 2020, 11 pages.

Aref, et al., "Quantum Acoustics with Surface Acoustic Waves", arxiv.org, Cornell University Library, 201, Olin Library Cornell University Ithaca, NY 14853, Jun. 4, 2015 (Jun. 4, 2015), XP081345581, DOI: 10.1007/978-3-319-24091-6_9 figures 9, 10.

Partial International Search Report and Written Opinion for International Application Serial No. PCT/EP2019/070100 dated Nov. 27, 2029, 17 pages.

Non-Final Office Action received for U.S. Appl. No. 16/048,935 dated Oct. 4, 2019, 28 pages.

Non-Final Office Action received for U.S. Appl. No. 16/385,667 dated Nov. 7, 2019, 20 pages.

Non-Final Office Action received for U.S. Appl. No. 16/358,277 dated Oct. 24, 2019, 23 pages.

International Search Report and Written Opinion for International Application Serial No. PCT/EP2019/070101 dated Oct. 29, 2019, 15 pages.

List of IBM Patents or Applications Treated as Related. Submitted on Mar. 19, 2020.

International Search Report and Written Opinion for International Application Serial No. PCT/EP2019/070100 dated Feb. 21, 2020, 26 pages.

Non-Final Office Action received for U.S. Appl. No. 16/048,935 dated May 1, 2020, 28 pages.

* cited by examiner

SUPERCONDUCTING DEVICE THAT MIXES SURFACE ACOUSTIC WAVES AND MICROWAVE SIGNALS

BACKGROUND

In quantum circuits, a Josephson ring modulator is coupled to two superconducting microwave resonators and three-way mixing is performed between differential modes supported by the two superconducting microwave resonators and a non-resonant, common drive fed to the Josephson ring modulator. Due to coupling the Josephson ring modulator to the two superconducting microwave resonators, the device is limited in the choice of the frequency of differential modes, which can cause one or more problems. For example, coupling the Josephson ring modulator to low-frequency, transmission-line resonators can have various problems, such as occupying a large area (e.g., a large footprint). Another problem is the relatively large linear inductance associated with the low resonance-frequency transmission-line compared to the inductance of the Josephson ring modulator. This can result in a very reduced participation ratio which in turn requires, for its operation, very high external quality factors (Qs) for the resonators. However, high external Qs for the resonators is undesirable because it can give rise to very narrow dynamical bandwidths, which severely limit the device usability and practicality.

In addition, coupling the Josephson ring modulator to low-frequency, lumped-element resonators can require the use of large lumped capacitances and large lumped inductances. Large lumped capacitances and inductances are difficult to realize in practice. Large capacitances can have considerable loss (lowering the internal Q of the device) and as a result can cause a considerable portion of the quantum signal to be lost. Large geometric inductances usually suffer from parasitic capacitances which limit their utility. Large kinetic inductances usually rely on unconventional thin superconductors which are difficult to fabricate and integrate.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein are devices, systems, methods, computer-implemented methods, apparatuses, and/or computer program products that mix surface acoustic waves and microwave signals.

According to an embodiment, a superconducting device can comprise a superconducting surface acoustic wave resonator and a superconducting microwave resonator. The superconducting device can also comprise a Josephson ring modulator coupled to the superconducting surface acoustic wave resonator and the superconducting microwave resonator. The Josephson ring modulator can be a dispersive nonlinear three-wave mixing element. An advantage of such a superconducting device is that dissipationless, three-wave mixing and amplification can be performed between low wave microwave frequencies of the superconducting surface acoustic wave resonator and high microwave frequencies of the superconducting microwave resonator.

In some examples, the superconducting surface acoustic wave resonator of the superconducting device can comprise a first superconducting Bragg mirror and a second superconducting Bragg mirror. The second superconducting Bragg mirror can be separated from the first superconducting Bragg mirror by a distance that is an odd integer multiple of a half-wavelength supported by the superconducting surface acoustic wave resonator. An advantage of such a superconducting device is that the superconducting device can operate over a single, a few, or many modes of the superconducting surface acoustic wave resonator.

According to some implementations, the superconducting device can also advantageously comprise a first external feedline coupled to the superconducting surface acoustic wave resonator through an interdigitated capacitance device. The first external feedline can carry one or more first input signals and one or more first output signals of the superconducting surface acoustic wave resonator. Further, the superconducting device can comprise a second external feedline coupled to the superconducting microwave resonator. The second external feedline can carry one or more second input signals and one or more second output signals of the superconducting microwave resonator. An advantage of such a superconducting device is that low frequencies of the superconducting surface acoustic wave resonator and high frequencies of the superconducting microwave resonator can be received, mixed, and amplified.

According to an embodiment, provided is a superconducting circuit that can comprise a superconducting surface acoustic wave resonator and a Josephson ring modulator coupled to the superconducting surface acoustic wave resonator. Further, the superconducting circuit can comprise a superconducting microwave resonator coupled to the Josephson ring modulator. The Josephson ring modulator is a dispersive nonlinear three-wave mixing element. According to some implementations, the superconducting surface acoustic wave resonator is realized on a low-loss piezoelectric dielectric substrate. An advantage of such a superconducting circuit is that dissipationless, three-wave mixing and amplification can be facilitated between low wave microwave frequencies of the superconducting surface acoustic wave resonator and high microwave frequencies of the superconducting microwave resonator.

The superconducting surface acoustic wave resonator of the superconducting circuit can comprise, according to some implementations, a first superconducting Bragg mirror and a second superconducting Bragg mirror. The first superconducting Bragg mirror and the second superconducting Bragg mirror can be separated by a distance that is an odd integer multiple of a half-wavelength supported by the superconducting surface acoustic wave resonator. An advantage of such a superconducting circuit is that low frequencies of the superconducting surface acoustic wave resonator and high frequencies of the superconducting microwave resonator can be received, mixed, and amplified.

In accordance with some implementations, the superconducting circuit can comprise a first external feedline coupled to the superconducting surface acoustic wave resonator through an interdigitated capacitance device. The first external feedline can carry one or more first input signals and one or more first output signals of the superconducting surface acoustic wave resonator. In addition, the superconducting circuit can comprise a second external feedline coupled to the superconducting microwave resonator. The second external feedline can carry one or more second input signals and one or more second output signals of the superconducting microwave resonator. An advantage of such a superconducting circuit is that low frequencies of the superconducting surface acoustic wave resonator and high frequencies of the superconducting microwave resonator can be received, mixed, and amplified.

Another embodiment relates to a method that can comprise forming a Josephson ring modulator that comprises one or more Josephson junctions arranged in a Wheatstone-bridge configuration. The method can also comprise coupling the Josephson ring modulator to a superconducting surface acoustic wave resonator and a superconducting microwave resonator. The Josephson ring modulator can be a dispersive nonlinear three-wave mixing element. An advantage of such a method is that a superconducting device can be fabricated, which can perform dissipationless, three-wave mixing between low wave microwave frequencies of the superconducting surface acoustic wave resonator and high microwave frequencies of the superconducting microwave resonator.

In some implementations, the method can comprise forming the superconducting surface acoustic wave resonator from a first superconducting Bragg mirror and a second superconducting Bragg mirror. The method can also comprise separating the first superconducting Bragg mirror from the second superconducting Bragg mirror by a distance defined as an odd integer multiple of a half-wavelength supported by the superconducting surface acoustic wave resonator. An advantage of such a method is that the fabricated superconducting device can operate over a single, a few, or many modes of the superconducting surface acoustic wave resonator A further embodiment relates to a superconducting device that can comprise a superconducting surface acoustic wave resonator. The superconducting surface acoustic wave resonator can comprise a first periodic structure comprising first metallic fingers and first dielectric gaps. The superconducting surface acoustic wave resonator can also comprise a second periodic structure comprising second metallic fingers and second dielectric gaps. The first periodic structure and the second periodic structure can be separated by a distance defined as an odd integer multiple of a half-wavelength supported by the superconducting surface acoustic wave resonator. Further, the superconducting device can comprise a dispersive nonlinear three-wave mixing element coupled to the superconducting surface acoustic wave resonator. The dispersive nonlinear three-wave mixing element can comprise one or more Josephson junctions arranged in a Wheatstone-bridge configuration. In addition, the superconducting device can comprise a superconducting microwave resonator coupled to the dispersive nonlinear three-wave mixing element. An advantage of such a superconducting device is that dissipationless, three-wave mixing and amplification can be performed between low wave microwave frequencies of the superconducting surface acoustic wave resonator and high microwave frequencies of the superconducting microwave resonator while occupying a small space and through the use of low-loss resonators.

DETAILED DESCRIPTION

Figure 1:
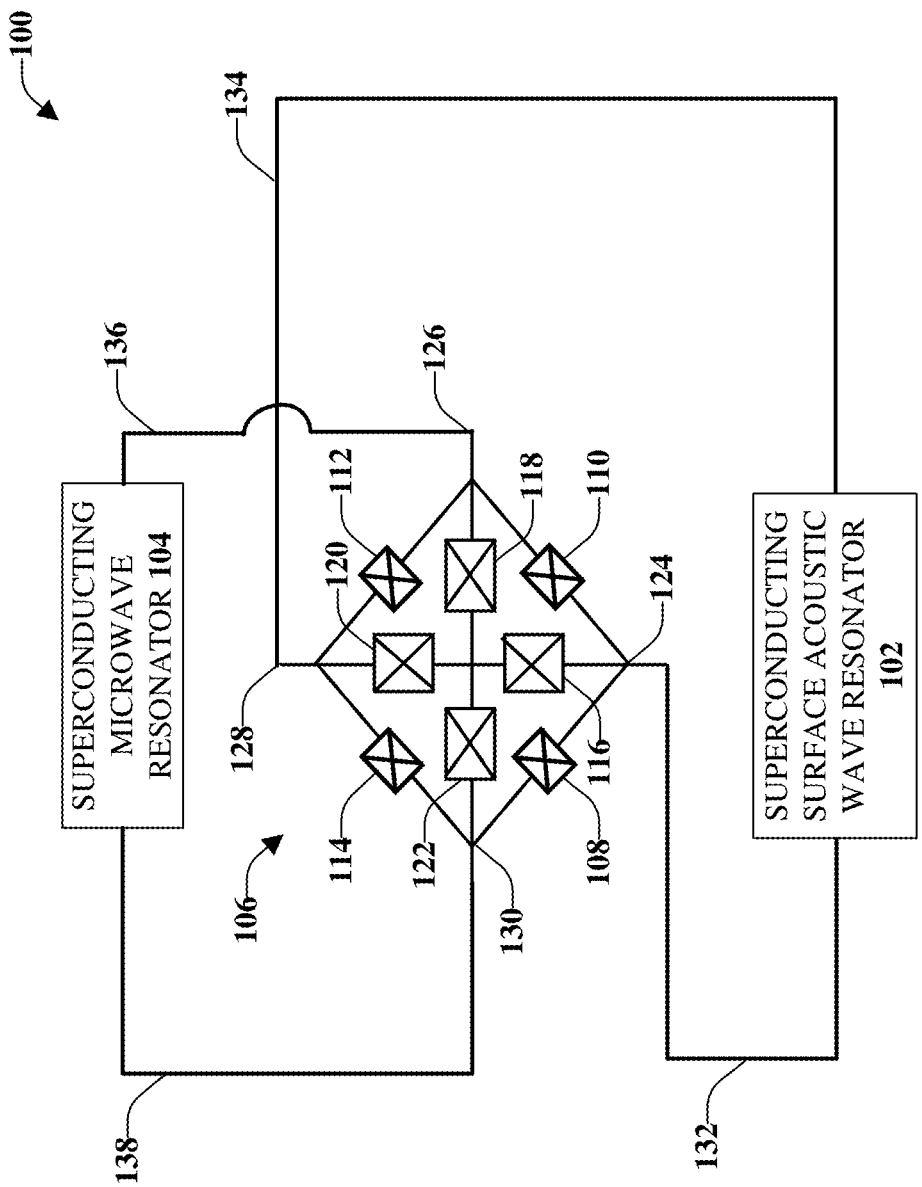
FIG. 1 illustrates an example, non-limiting block diagram of a circuit comprising the Josephson ring modulator in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

As it relates to circuits, and more specifically quantum circuits, if a Josephson ring modulator (JRM) is coupled to two superconducting wave resonators, there is a limitation with respect to the choice of the differential modes that couple to the JRM. For example, a problem associated with coupling the JRM to low-frequency, transmission-line resonators is that a large area is occupied by the device. A solution provided by the superconducting device, the superconducting circuit, and the methods discussed herein is that a superconducting surface acoustic wave resonator is utilized, which is compact and, therefore, a size of the superconducting device is reduced.

Another problem associated with prior art superconducting devices (e.g., devices that utilize two superconducting microwave resonators) is that the prior art superconducting devices are limited to mixing frequencies between 5 Gigahertz (GHz) and 15 GHz. The various superconducting devices, circuits, and methods discussed herein provide a solution to this problem through the utilization of a superconducting surface acoustic wave resonator and superconducting wave resonator that enable dissipationless, three-wave mixing and amplification between low microwave frequencies (e.g., about 0.1 GHz to about 4 GHz) and high microwave frequencies (e.g., around 5 GHz to around 15 GHz).

Given the above problems with prior art superconducting devices, the various aspects provided herein can be implemented to produce a solution to one or more of these problems in the form of a superconducting device, superconducting circuit, and method of fabricating the same. Such systems, devices, circuits, methods, computer-implemented methods, and/or computer program products implementing such a superconducting device can have an advantage of reduced size and low-loss resonators, as compared to conventional techniques.

According to some implementations, the device can function as a Josephson mixer between surface acoustic waves (phonons) and microwave signals (photons). Additionally, or alternatively, the device can function as a lossless frequency converter between a surface acoustic wave and a microwave signal. Additionally, or alternatively, the device can function as a nondegenerate parametric Josephson amplifier for a surface acoustic wave and a microwave signal. In additional or alternative implementations, the device can function as an entangler of a phononic mode and photonic mode.

FIG. 1 illustrates an example, non-limiting block diagram of a circuit 100 in accordance with one or more embodiments described herein. The circuit 100 can comprise a superconducting surface acoustic wave (SAW) resonator (referred to as a superconducting SAW resonator 102), a superconducting microwave resonator 104, and a Josephson ring modulator (referred to as a JRM 106).

In a piece of quantum hardware, which includes the superconducting qubits space, a mechanism to implement gate operations or measurements on the quantum hardware is to generate microwave signals or receive microwave signals by the superconducting SAW resonator 102 and/or via the superconducting microwave resonator 104. As discussed herein, according to some implementations, the circuit 100 can operate as a Josephson mixer between surface acoustic waves (phonons) and microwave signals (photons). Further, the circuit 100 can operate as a lossless frequency converter between a surface acoustic wave and a microwave signal. In some implementations, the circuit 100 can operate as a nondegenerate parametric Josephson amplifier for a surface acoustic wave and a microwave signal. In additional and/or alternate implementations, the device can operate as an entangler of a phononic mode and photonic mode.

SAW resonators (e.g., the superconducting SAW resonator 102) are electro-mechanical resonators for phonons, which can resonate at microwave frequencies of around 0.5 GHz to 5 GHz. Surface acoustic wave resonators (or surface acoustic wave filters) are used in many telecommunication applications (e.g., mobile phones). SAW resonators can also be useful in quantum computing applications and quantum circuits in the microwave domain, as discussed herein. Further, surface acoustic wave resonators can have high internal Quality (Q) factors, which can be in excess of $10^5$. Therefore, SAW resonators can have a very low loss. In addition, SAW resonators are very compact. For example, the surface acoustic resonance wavelengths are very short (e.g., less than 1 micro metre or <1 μm).

The superconducting SAW resonator 102 can be a low frequency device and the superconducting microwave resonator 104 can be a high frequency device. Further, the superconducting SAW resonator 102 can be implemented on a low-loss piezo-electric dielectric substrate. The low-loss piezo-electric dielectric substrate can comprise a material selected from a group of materials comprising quartz, gallium arsenide, lithium niobite, and/or zinc oxide, or the like. The superconducting microwave resonator 104 can be implemented using lumped-element capacitance and lumped-element inductance. Further details related to the superconducting SAW resonator 102 and the superconducting microwave resonator 104 will be provided below with respect to FIGS. 2 and 3.

The JRM 106 is a device that can be based on Josephson tunnel junctions. For example, the JRM 106 can comprise one or more Josephson junctions arranged in a Wheatstone-bridge configuration. The one or more Josephson junctions can comprise a material selected from a group of materials comprising aluminum and niobium. Further, the JRM 106 can perform non-degenerate mixing in the microwave regime, without losses. According to some implementations, the JRM 106 can be a dispersive nonlinear three-wave mixing element.

The JRM 106 can support two differential modes and two common modes (one of which is at zero frequency, and, therefore, not applicable to the one or more embodiments described herein). By coupling the JRM 106 to a suitable electromagnetic environment (which supports two differential microwave modes), the circuit 100 can be used to perform various quantum processing operations such as lossless frequency conversion in the microwave domain, parametric amplification at the quantum limit (e.g., amplification of quantum signals in the microwave domain), and/or generation of two-mode squeezing.

The Josephson ring modulator (e.g., the JRM 106) can comprise one or more Josephson junctions arranged in a Wheatstone-bridge configuration. The Josephson junctions are illustrated as a first Josephson junction 108, a second Josephson junction 110, a third Josephson junction 112, and a fourth Josephson junction 114. The Josephson junctions (e.g., the first Josephson junction 108, the second Josephson junction 110, the third Josephson junction 112, the fourth Josephson junction 114) can be formed in a loop. Further, the Josephson junctions can be utilized to perform the mixing as discussed herein.

The JRM 106 also can comprise four additional junctions (internal to the loop), which can be shunt junctions according to some implementations. These four additional junctions are labeled as a first internal junction 116, a second internal junction 118, a third internal junction 120, and a fourth internal junction 122. The four internal junctions (e.g., the first internal junction 116, the second internal junction 118, the third internal junction 120, and the fourth internal junction 122) can facilitate tuning of the frequency of the circuit 100. The tunability can be obtained with the application of external magnetic flux. For example, induced magnetic flux threads the Josephson ring modulator. In this configuration, the four internal junctions, which are larger than the junctions on the outer loop, can function as linear inductors shunting the outer Josephson junctions. By threading external flux through the inner loops, the total inductance of the JRM 106 can change, which can lead to a change in the resonance frequencies of the resonator coupled to the JRM 106. According to some implementations, threading the external flux can be facilitated with magnetic coils, on-chip flux lines, nearby flux lines, and/or on a different chip/layer.

In addition, the configuration of the JRM 106 defines points or nodes where the external junctions meet. Accordingly, there can be a first node 124 at the bottom of the JRM 106; a second node 126 at the right side of the JRM 106; a third node 128 at the top of the JRM 106; and a fourth node 130 at the left side of the JRM 106. It is noted that the terms bottom, right side, top, and left side are for purposes of explaining the disclosed aspects with respect to the figures and the disclosed aspects are not limited to any particular plane or orientation of the JRM 106 and/or the circuit 100 and its associated circuitry.

The four nodes (e.g., the first node 124, the second node 126, the third node 128, and the fourth node 130) can be utilized to define the differential mode and the common mode hosted by the circuit 100. The modes can be orthogonal and do not overlap one another. Further, the nodes, as illustrated, can be physically orthogonal. For example, the first node 124 and the third node 128 are vertical to one another and the second node 126 and the fourth node 130 are horizontal to one another.

The nodes can be utilized to couple the JRM 106 to the superconducting SAW resonator 102 and to the superconducting microwave resonator 104. For example, a first set of opposite nodes (e.g., the first node 124 and the third node 128) can be chosen to operatively couple the JRM 106 to the superconducting SAW resonator 102. The first node 124 can be coupled to the superconducting SAW resonator 102 via a first wire 132 (or first lead) and the third node 128 can be coupled to the superconducting SAW resonator 102 via a second wire 134 (or second lead).

The second set of opposite nodes (e.g., the second node 126 and the fourth node 130) can be chosen to operatively couple the JRM 106 to the superconducting microwave resonator 104. For example, the second node 126 can be coupled to the superconducting microwave resonator 104 via a third wire 136 (or third lead) and the fourth node 130 can be coupled to the superconducting microwave resonator 104 via a fourth wire 138 (or fourth lead).

As illustrated, the first wire 132 and the second wire 134 can be coupled to the superconducting SAW resonator 102 at different locations of the superconducting SAW resonator 102. Further, the third wire 136 and the fourth wire 138 can be coupled to the superconducting microwave resonator 104 at different locations of the superconducting microwave resonator 104. Further details related to the coupling locations will be provided below with respect to FIG. 3.

The superconducting SAW resonator 102, the superconducting microwave resonator 104, and the JRM 106 are portions of a frequency-converter/mixer/amplifier/entangler device. The device can receive external microwave photons or phonons from other quantum devices connected to the microwave port and/or the SAW port of the device.

The circuit 100, as well as other aspects discussed herein can be utilized in a device that facilitates manipulation of quantum information in accordance with one or more embodiments described herein. Aspects of devices (e.g., the circuit 100 and the like), systems, apparatuses, or processes explained in this disclosure can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform the operations described.

In various embodiments, the device can be any type of component, machine, system, device, facility, apparatus, and/or instrument that comprises a processor and/or can be capable of effective and/or operative communication with a wired and/or wireless network. Components, machines, apparatuses, systems, devices, facilities, and/or instrumentalities that can comprise the device can include tablet computing devices, handheld devices, server class computing machines and/or databases, laptop computers, notebook computers, desktop computers, cell phones, smart phones, consumer appliances and/or instrumentation, industrial and/or commercial devices, hand-held devices, digital assistants, multimedia Internet enabled phones, multimedia players, and the like.

In various embodiments, the device can be a quantum computing device or quantum computing system associated with technologies such as, but not limited to, quantum circuit technologies, quantum processor technologies, quantum computing technologies, artificial intelligence technologies, medicine and materials technologies, supply chain and logistics technologies, financial services technologies, and/or other digital technologies. The circuit 100 can employ hardware and/or software to solve problems that are highly technical in nature, that are not abstract and that cannot be performed as a set of mental acts by a human. Further, in certain embodiments, some of the processes performed can be performed by one or more specialized computers (e.g., one or more specialized processing units, a specialized computer with a quantum computing component, etc.) to carry out defined tasks related to machine learning.

The device and/or components of the device can be employed to solve new problems that arise through advancements in technologies mentioned above, computer architecture, and/or the like. One or more embodiments of the device can provide technical improvements to quantum computing systems, quantum circuit systems, quantum processor systems, artificial intelligence systems and/or other systems. One or more embodiments of the circuit 100 can also provide technical improvements to a quantum processor (e.g., a superconducting quantum processor) by improving processing performance of the quantum processor, improving processing efficiency of the quantum processor, improving processing characteristics of the quantum processor, improving timing characteristics of the quantum processor, and/or improving power efficiency of the quantum processor.

Figure 2:
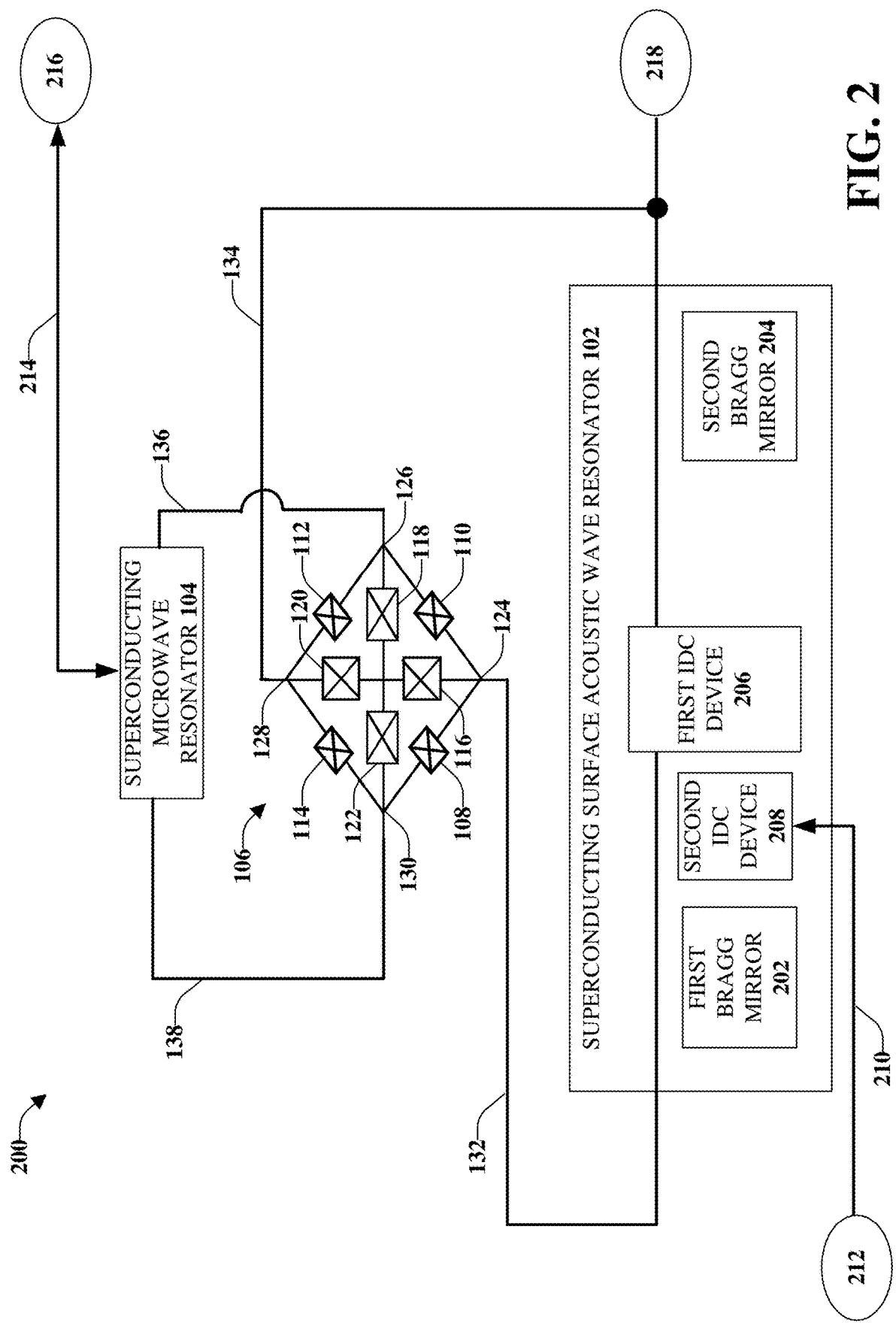
FIG. 2 illustrates an example, non-limiting block diagram of a circuit comprising a superconducting surface acoustic wave resonator in accordance with one or more embodiments described herein.

FIG. 2 illustrates an example, non-limiting block diagram of a circuit 200 comprising a superconducting surface acoustic wave (SAW) resonator in accordance with one or more embodiments described herein. Repetitive description of like elements employed in other embodiments described herein is omitted for sake of brevity.

The superconducting SAW resonator 102 can comprise a first superconducting metallic/dielectric mirror (e.g., a first Bragg mirror 202) and a second superconducting metallic/dielectric mirror (e.g., a second Bragg mirror 204). The first Bragg mirror 202 can be separated from the second Bragg mirror 204 by a distance that is an odd integer multiple of a half-wavelength supported by the superconducting SAW resonator 102. A Bragg mirror comprises a periodic structure of metallic fingers and dielectric gaps positioned at a defined distance from one another.

According to some implementations, the superconducting SAW resonator 102 can be attached to (e.g., realized on) a low-loss piezo-electric dielectric substrate (not shown). The low-loss piezo-electric dielectric substrate can comprise a material selected from a group of materials comprising one or more of quartz, gallium arsenide, lithium niobite, and zinc oxide, or a similar material.

Further, a first interdigitated capacitance device or first IDC device 206 and a second IDC device 208 can be included. The first IDC device 206 can couple between the superconducting SAW resonator 102 and the JRM 106. The second IDC device 208 can couple between the superconducting SAW resonator 102 and an external port (e.g., a signal port 212).

For example, the first IDC device 206 can be positioned at a center of the superconducting SAW resonator 102. A first set of opposite nodes of the JRM 106 can be connected to opposite nodes of the first IDC device 206. For example, the first node 124 of the JRM 106 can be connected to a first side of the first IDC device 206 (e.g., via the first wire 132). Further, the third node 128 of the JRM 106 can be connected to a second side of the first IDC device 206 (e.g., via the second wire 134).

A second set of opposite nodes of the Josephson ring modulator can be connected to the superconducting microwave resonator 104. For example, the second node 126 of the JRM 106 can be connected to a first side of the superconducting microwave resonator 104 (e.g., via the third wire 136). Further, the fourth node 130 of the JRM 106 can be connected to a second side of the superconducting microwave resonator 104 (e.g., via the fourth wire 138).

The circuit 100 can also comprise a first external feedline 210 coupled to the superconducting SAW resonator 102 through the second IDC device 208. The first external feedline 210 can be connected to a signal port 212 (e.g., a radio frequency (rf) source). The first external feedline 210 can carry one or more input signals and one or more output signals of the superconducting SAW resonator 102.

A second external feedline 214 can be coupled to the superconducting microwave resonator 104. The second external feedline 214 can be connected to an idler port 216 (e.g., a microwave source). The second external feedline 214 can carry one or more input signals and one or more output signals of the superconducting microwave resonator 104.

Further, the JRM 106 can be operative connected to a pump port 218 (e.g., via the second wire 134 or another wire). The pump port 218 can be connect to a microwave source. The pump port 218 can supply the required energy for the operation of the circuit 100. For example, upon or after pump power is supplied from the pump port 218 to the JRM 106, the superconducting SAW resonator 102 and the superconducting microwave resonator 104 can be electrically connected through the JRM 106. However, when power is not supplied through the pump port 218 (e.g., the power supply is off), the superconducting SAW resonator 102 and the superconducting microwave resonator 104 can be electrically isolated from one another.

For amplification, ideally there would be a microwave signal that is propagating on the idler transmission line (e.g., the second external feedline 214) that is connected to the idler port 216. In an example, assume that the microwave signal is weak and it carries some quantum information that is of value. The information goes into the circuit 100 and there is a pump tone that is fed to the device (e.g., via the pump port 218) that can generate a parametric amplification between the idler mode and the signal mode supported by the superconducting SAW resonator 102. In this example, an input signal is not needed at both the signal port 212 and the idler port 216. Instead, a signal is only needed on one port and quantum noise can enter through the other port. The deterministic signal carrying quantum information and the quantum noise can be mixed by the device via the pump drive and amplified upon leaving the device. Thus, the signal that carries information can come either from the signal port 212, or the idler port 216, or can have two signals carrying information entering both ports at substantially the same time. For simplicity, assume the signal is entering the circuit 100 through one port and the other port is only receiving quantum noise. In this case, through the interaction with the pump (e.g., the pump port 218) and the JRM 106 three-wave mixing takes place between the common mode (pump) and two differential modes (the idler and the signal). If the pump frequency is the sum of the signal and idler resonance frequencies, the device functions as a phase-preserving parametric amplifier operating near the quantum limit. The respective output signal exiting the signal port 212 and idler port 216 can be an amplified superposition of the input signals entering both ports (e.g., the signal port 212 and idler port 216).

According to some implementations, magnetic flux threading the JRM 106 can be induced through the one or more external superconducting magnetic coils. For example, magnetic flux threading the JRM 106 can be induced using external superconducting magnetic coils attached to a device package or using on-chip flux lines.

Figure 3:
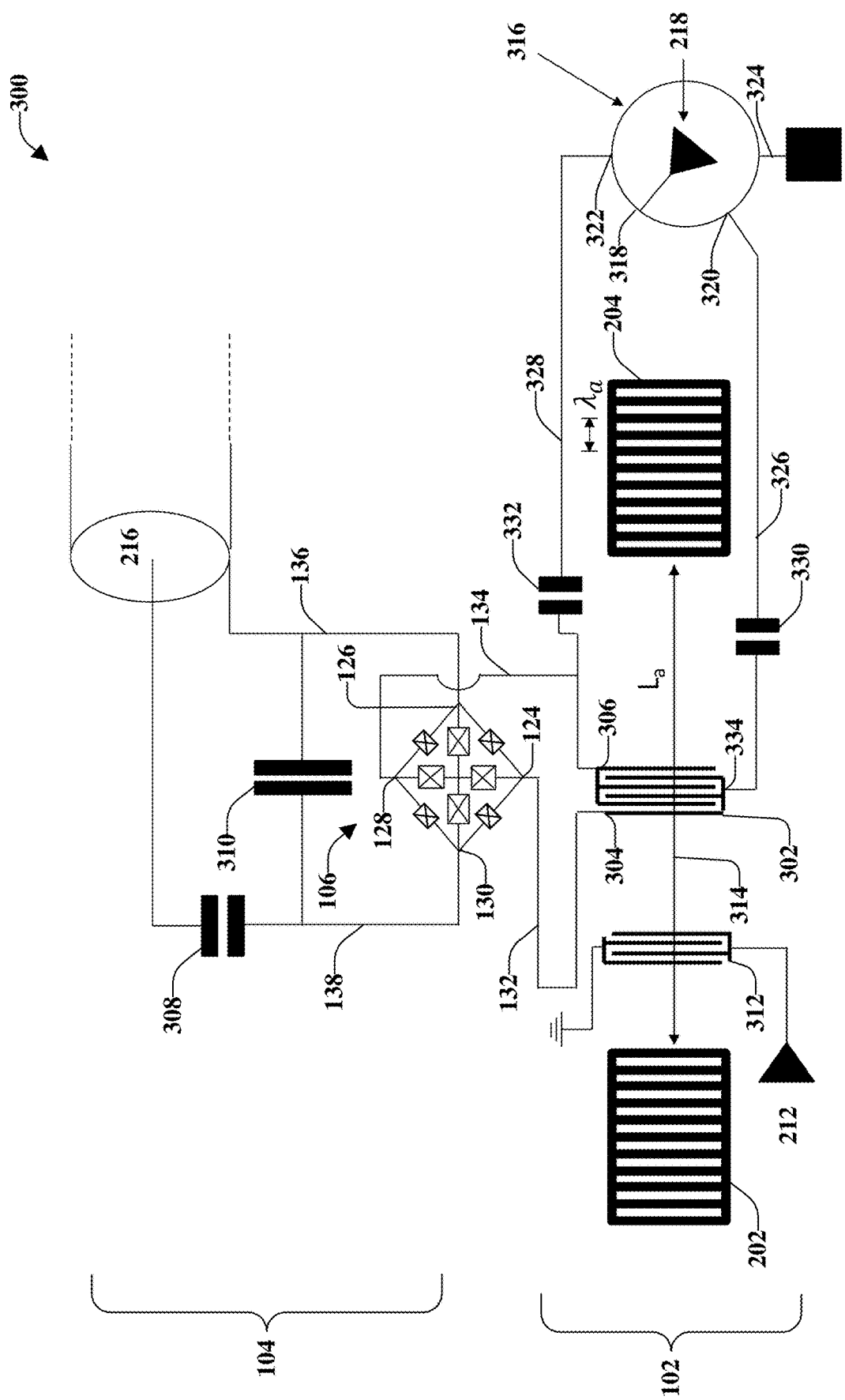
FIG. 3 illustrates an example, non-limiting, schematic of a circuit for a superconducting device that comprises a surface acoustic wave resonator and superconducting microwave resonator coupled to a Josephson ring modulator in accordance with one or more embodiments described herein.

In further detail, FIG. 3 illustrates an example, non-limiting, schematic of a circuit 300 for a superconducting device that comprises a surface acoustic wave resonator and superconducting microwave resonator coupled to a Josephson ring modulator in accordance with one or more embodiments described herein. Repetitive description of like elements employed in other embodiments described herein is omitted for sake of brevity.

It is noted that the Josephson junctions and the four internal junctions of the JRM 106 are not labeled in FIG. 3 for purposes of simplicity. However, the element numbering of the junctions for purposes of explanation are the same as the labeling of FIGS. 1 and 2. In addition, the circuit 300 and its associated components can be implemented on a single chip, according to some implementations.

As mentioned, the nodes of the JRM 106 can comprise a first set of opposite nodes that can be oriented in a vertical direction to one another. For example, the first set of opposite nodes can comprise the first node 124 and the third node 128, which can operatively couple the JRM 106 to the superconducting SAW resonator 102 (e.g., via the first wire 132 and the second wire 134). Further, the nodes of the JRM 106 can comprise a second set of opposite nodes, which can be oriented in a horizontal manner. For example, the second set of opposite nodes can comprise the second node 126 and the fourth node 130, which can operatively couple the JRM 106 to the superconducting microwave resonator 104. It is noted that although illustrated and described with respect to a horizontal direction and/or a vertical direction, the disclosed aspects are not limited to this orientation and other orientations can be utilized.

The first set of opposite nodes (e.g., the first node 124 and the third node 128) can be coupled to opposite electrodes of a first interdigitated capacitor or first IDC 302 (e.g., the first IDC device 206) of the superconducting SAW resonator 102, creating a first orthogonal mode. For example, the first node 124 of the JRM 106 can be coupled to a first electrode of the first IDC 302, indicated at 304. Further, the third node 128 of the JRM 106 can be coupled to a second electrode of the first IDC 302, indicated at 306. The first IDC 302 can be positioned at a center of the superconducting SAW resonator 102.

The second set of opposite nodes (e.g., the second node 126 and the fourth node 130) can be coupled to a second capacitor 310 (e.g., a shunting capacitor) forming a superconducting microwave resonator 104, where the JRM is the inductive element of the resonator. The superconducting microwave resonator can support a second orthogonal differential mode of the JRM 106. The capacitance (e.g., the first capacitor 308) functions as a coupling capacitor between the microwave resonator (formed by the JRM 106 and the second capacitor 310) and the external feedline/port (e.g., the idler port 216) of the device. According to some implementations, the first capacitor 308 and the second capacitor 310 can be respective capacitors chosen from a group of capacitors comprising a gap capacitor, an interdigitated capacitor, and/or a plate capacitor. In the case of plate capacitance, the dielectric material should have very low-loss at the level of single microwave photons.

As illustrated, the superconducting SAW resonator 102 can comprise the first IDC 302, a second IDC 312 (e.g., the second IDC device 208), and a set of metallic/dielectric mirrors (e.g., the first Bragg mirror 202 and the second Bragg mirror 204). The components of the superconducting SAW resonator 102 (e.g., the first IDC 302, the second IDC 312, the first Bragg mirror 202, the second Bragg mirror 204) is implemented on a piezo-electric substrate. For example, the piezo electric substrate can comprise one or more of quartz, gallium arsenide, lithium niobite, zinc oxide, and/or similar materials.

Different ports can be utilized to access the superconducting SAW resonator 102 and the superconducting microwave resonator 104. For example, the signal port 212 can be utilized to access the superconducting SAW resonator 102 and the idler port 216 can be utilized to access the superconducting microwave resonator 104.

The signal port 212 can be utilized to carry input signals and output signals. Therefore, in order to measure output signals from the superconducting SAW resonator 102, an IDC (e.g., the second IDC 312) can be placed between the first Bragg mirror 202 and the second Bragg mirror 204. One set of IDC fingers that are connected together are located at an rf-voltage anti-node (maximum/minimum) of the supported phononic mode. Therefore, the spacing between the fingers can be determined by the wavelength supported by the superconducting SAW resonator 102.

A distance between the centers of two consecutive fingers of the IDCs (e.g., the first IDC 302 and the second IDC 312) can be generally expressed as $\lambda_a/2$. The respective two sets of fingers of the IDCs can have opposite polarity according to an implementation. Further, the first Bragg mirror 202 and the second Bragg mirror 204 can be separated from one other, as indicated by line 314, by a distance that is an odd integer multiple of half-wavelength supported by the superconducting SAW resonator 102. The defined distance can be expressed as $L_a$, wherein $L_a$ is an odd-integer multiple of $\lambda_a/2$. Where $\lambda_b < \lambda_a$.

A microwave tone is characterized by a wave that has a maximum amplitude and a minimum amplitude. The minimum amplitude should couple to one finger of the IDC (e.g., indicated at 304 or 306) and the maximum value should couple to the other finger, (e.g., indicated at 304 or 306) where the two fingers are connected to opposite nodes of the JRM 106 (e.g., the first node 124 and the third node 128).

Therefore, the distance $\lambda_a/2$ can be selected to facilitate the maximum on the first finger and the minimum on the other finger.

Further, for purposes of explanation, the maximum amplitude has a plus sign (or a positive value) and the minimum amplitude has a minus sign (or a negative value). Therefore, the two opposite nodes of the JRM 106 can be excited by the positive (on the first finger) and the negative rf-voltages (on the second finger). These signals can alternate with time. However, they should be opposite to one another at any given time. When the polarity is different, it can be referred to as a differential mode (where differential means opposite sign).

This can also apply to the case of the superconducting microwave resonator 104. As mentioned, the superconducting microwave resonator can comprise a first capacitor 308 coupling the resonator to the external port (e.g., the idler port 216) and the second capacitor 310 shunting the JRM 106. The two electrodes of the capacitor shunting the JRM 106 (e.g., the second capacitor 310) can have opposite voltages and can excite a second differential mode. Accordingly, a first differential mode of the JRM 106 is supported by the superconducting SAW resonator 102 and a second differential mode of the JRM 106 is supported by the superconducting microwave resonator 104.

Further, in order to perform the mixing, or the amplification, microwave energy is supplied for device operation. The energy source for the mixing and/or amplification is supplied through the pump port 218. The pump port 218 can provide a microwave signal, which can be a strong, coherent, non-resonant microwave tone that can supply energy for the circuit 100 to operate. According to some implementations, the microwave signal supplied by the pump port 218 can comprise a frequency that satisfies a defined equation determined based on the energy conservation of the three-wave mixing occurring in the circuit 100.

In an example of amplification performed by the device, a first signal $f_a$ which lies within the bandwidth of the superconducting SAW resonator 102 and a second signal $f_b$ which lies within the bandwidth of the superconducting microwave resonator 104. Further, the frequency of the second signal can be larger than the frequency of the first signal ($f_b > f_a$). To amplify both signals, the frequency of the pump tone fed through the pump port 218 should be the sum of the first signal and the second signal (e.g., $f_a + f_b$). The energy of the electromagnetic signal is proportional to its frequency. By taking the pump (e.g., the pump port 218) frequency to be the sum, if the pump interacts with the dispersive nonlinear medium (e.g., the JRM 106), a down-conversion process can occur where the energetic photons of the pump split into a first set of photons at $f_a$ and a second set of photons at $f_b$. If the frequency is the sum, then the photons can split in this manner. For example, the photons can split into two halves: a first half (e.g., the first set of photons) at the lower frequency $f_a$ and a second half (e.g., the second set of photons) at the higher frequency $f_b$. Therefore, amplification can occur because the pump exchanges energy with the signal mode and idler mode and through this exchange entangled photons are generated in both modes. Similarly, a conversion process with non phonon-photon gain can convert one mode to the other (e.g., a photon to a phonon or a phonon to a photon). In this case, the pump frequency should be equal to the difference between $f_a$ and $f_b$. Here $f_b$ is larger, so the equation can be $f_b$ minus $f_a$.

According to an implementation, in the mixing process (conversion without photon-phonon gain) a phonon in the SAW resonator at the signal frequency can be upconverted into a microwave photon in the microwave resonator at the idler frequency. According to another implementation, the photon in the microwave resonator at the idler frequency can be downconverted to a phonon in the SAW resonator at the signal frequency. The energy exchange is enabled by the pump drive (e.g., fed through the pump port 218). Accordingly, either a pump photon is emitted or a pump photon is absorbed to facilitate the process.

If there is no pump signal applied to the pump port 218, the superconducting SAW resonator 102 and the superconducting microwave resonator 104 are separated (e.g., isolated from one another) and information exchange or information communications between the superconducting SAW resonator 102 and the superconducting microwave resonator 104 does not occur. Upon or after a pump signal is applied to the pump port 218, it excites the common mode of the JRM 106, as illustrated in FIG. 2, the superconducting SAW resonator 102 and the superconducting microwave resonator 104 interact and information is exchanged.

According to some implementations, the pump drive is fed through the sigma port of a 180-degree hybrid 316, which is capacitively coupled to opposite nodes of the JRM 106, which in turn excites a common-mode of the JRM 106. According to some implementations, the 180-degree hybrid 316 operates as a power splitter.

By way of explanation and not limitation, a 180-degree hybrid is a passive microwave component that comprises four ports. A first port is referred to as a sum port 318 (or sigma port). If a signal is input to the sum port 318, the signal splits equally between two other ports (e.g., a second port 320 and a third port 322). The signals that are output from the second port 320 and the third port 322 can have the same phase. Thus, the first port is referred to as the sum port 318 because the phases of the split signals are equal. The pump drive (e.g., the pump port 218) can be fed through the sum port 318 of the 180-degree hybrid 316.

A fourth port can be referred to as a delta port 324 (or a difference port). If a signal is injected through the delta port 324 of the 180-degree hybrid (which, in FIG. 3, is terminated with 50 ohms), the hybrid would split the signal into two signals, coming out of the two ports (e.g., the second port 320 and the third port 322), but the split signals have a 180-degree phase difference. For example, if a first signal has a maximum value at one port (e.g., 320), the second signal at the other port (e.g., 322) has a minimum value. The pump port 218 can be fed through the sum port 318.

Also illustrated are a first lead 326 coming out of the second port 320 and a second lead 328 coming out of the third port 322. The signals that are output at the second port 320 and the third port 322 are half of the pump signal and have the same phase, as discussed above. The signals encounter small coupling capacitors (e.g., a first coupling capacitor 330 and a second coupling capacitor 332) that can be coupled to two opposite nodes of the JRM 106. According to some implementations, the first coupling capacitor 330 and the second coupling capacitor 332 can be respective capacitors chosen from a group of capacitors comprising a gap capacitor, an interdigitated capacitor, and a plate capacitor. As it relates to plate capacitance, the dielectric material should have very low-loss at the level of single microwave photons.

The first coupling capacitor 330 can be coupled to the first node 124 of the JRM 106 (through the first IDC 302) and the second coupling capacitor 332 can be coupled to the third node 128 of the JRM 106. In further detail, the first lead 326 and the second lead 328 can couple to two different sets of fingers of the first IDC 302 (illustrated at the first contact point 306 and a third contact point 334), that couple to two opposite nodes of the JRM 106. This connection enables exciting the common mode of the JRM 106 where the two opposite nodes of the JRM 106 are excited, not with opposite rf-voltage signs, but with equal signs. For example, the two opposite nodes can be excited with a positive-positive signal or a negative-negative signal.

The first lead 326 and the second lead 328 can be connecting superconducting wires that should be equal in length (e.g., phase matched) between the ports (e.g., the second port 320, the third port 322) of the 180 degree hybrid and the coupling capacitors (e.g., the first coupling capacitor 330, the second coupling capacitor 332, respectively). Also, the first wire 132 and the second wire 134 can be connecting superconducting wires that should be equal in length (e.g., phase matched) between the opposite nodes of the JRM 106 and the electrodes of the first IDC 302. Also, the third wire 136 and the fourth wire 138 can be connecting superconducting wires that should be equal in length (e.g., phase matched) between the opposite nodes of the JRM 106 and the electrodes of the second capacitor 310. Further, the connecting superconducting wires should be as short as possible and wide (e.g., have small series inductance).

The following provides further technical comments for an understanding of the various aspects disclosed herein. The speed of sound in the various piezoelectric substrates can be slower than the speed of light by several orders of magnitude (e.g., approximately five orders of magnitude, for example, $10^5$).

The effective length of the superconducting SAW resonator 102 can be slightly larger than $L_a$. This can be because the reflection off the Bragg mirrors does not happen on the mirror edges but within a certain penetration depth inside the Bragg mirrors.

The effective length ($L_{eff}$) of the superconducting SAW resonator 102 and the speed of sound in the piezoelectric substrate ($v_s$) can determine the cavity free spectral range (FSR):

$$V_{FSR} = \frac{v_s}{2L_{eff}}.$$

The SAW resonator can be similar to photonic cavities that support multimodes (resonances). The cavity free spectral range parameter can determine the frequency spacing between the multimodes supported by the superconducting SAW resonator 102.

The larger the spacing between the Bragg mirrors, the larger $L_{eff}$ is, and as a result the smaller the frequency separation between the SAW resonator modes. The Bragg mirrors can operate as reflective mirrors within a certain bandwidth. Modes that fall beyond their bandwidth are not supported by the SAW resonator because their phononic modes are not confined.

Depending on the $V_{FSR}$ and the bandwidth of the Bragg mirrors, the circuit 100 can operate over a single, a few, or many modes of the SAW resonator. It is noted that not all the modes supported by the SAW resonator would strongly couple to the JRM. Three-wave mixing operations in the circuit 100 can take place with phononic modes that couple strongly to the JRM. Modes couple strongly to the JRM when their anti-nodes align with the IDC fingers coupled to the JRM.

The circuit 100 can be a three-wave mixer, such as a Josephson mixer that relies on non-linear inductance of the Josephson junctions, which is lossless. The Josephson mixer is used to allow mixing between phonons supported by the superconducting SAW resonator 102 and microwave signals, which are carried by photons. This is different from conventional devices that couple a phonon to a phonon or a photon to a photon. Therefore, the disclosed aspects provide a significant improvement in the coupling. For example, the circuit 100 can allow conversion from a microwave signal to acoustic waves that resonate at low microwave frequencies. Further, the circuit 100 can amplify in a nondegenerate manner Nondegenerate here means: (1) the circuit 100 is amplifying two different frequencies: one frequency at a high microwave frequency (example 12 GHz) and another relatively low microwave frequency (example 1 GHz), thus, nondegenerate means that the frequencies are different so there is a spectral nondegeneracy; and (2) there is also a spatial nondegeneracy because the microwave signal is supported by the superconducting microwave resonator 104, which is physically different than the superconducting SAW resonator 102 that supports the surface acoustic wave. Therefore, there is a spectral and a physical nondegeneracy. Due to this process of parametric amplification that is nondegenerate, the circuit 100 can entangle a phononic mode with a photonic mode, where entanglement is a quantum property where the two modes are strongly correlated with one another and inseparable from one another. Therefore, if a measurement is taken of one, the state of the other can be determined. Thus, they are entangled and they form one entity, although they can be separated in space by distance.

Figure 4:
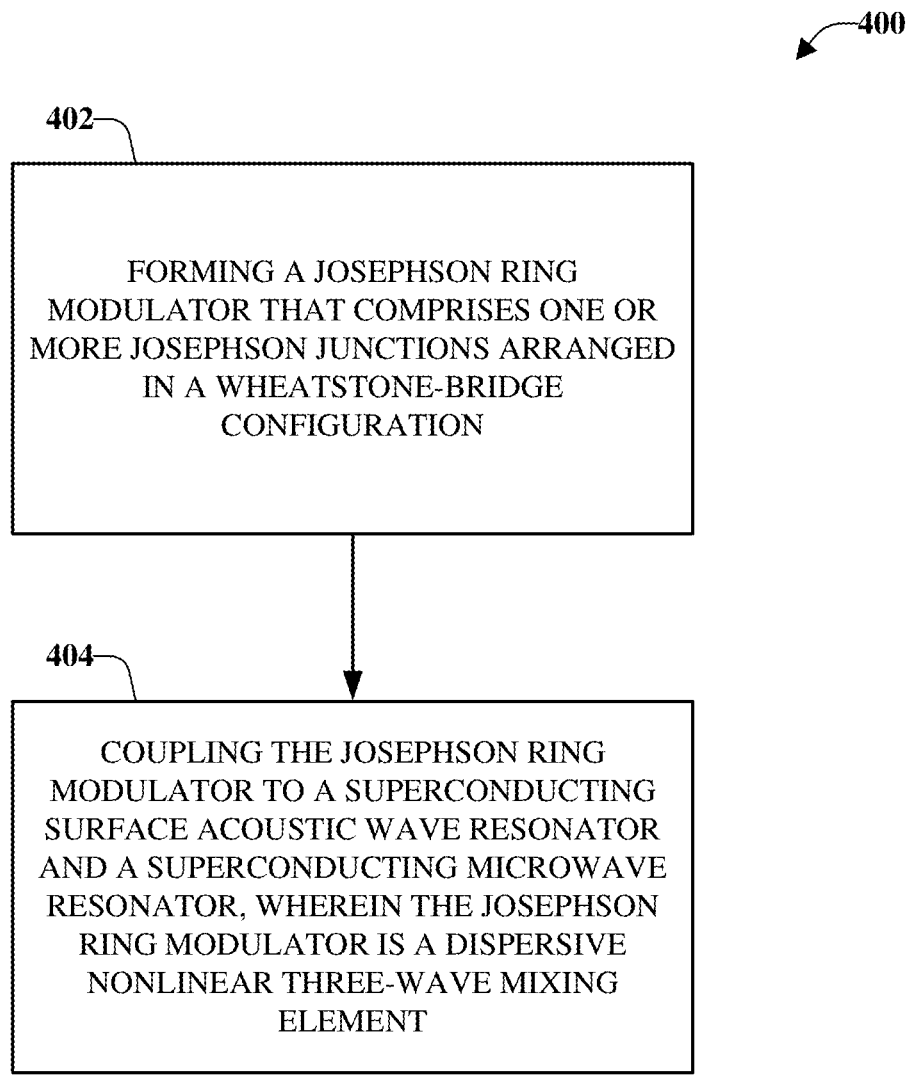
FIG. 4 illustrates a flow diagram of an example, non-limiting, method for fabrication of a device in accordance with one or more embodiments described herein.

FIG. 4 illustrates a flow diagram of an example, non-limiting, method 400 for fabrication of a device in accordance with one or more embodiments described herein. Repetitive description of like elements employed in other embodiments described herein is omitted for sake of brevity.

At 402 of the method 400, a Josephson ring modulator (e.g., the JRM 106) can be formed. The Josephson ring modulator can comprise one or more Josephson junctions (e.g., the first Josephson junction 108, the second Josephson junction 110, the third Josephson junction 112, the fourth Josephson junction 114) arranged in a Wheatstone-bridge configuration. The one or more Josephson junctions can comprise a first material selected from a first group of materials comprising aluminum and niobium.

Further, at 404 of the method 400, the Josephson ring modulator can be coupled to a superconducting surface acoustic wave resonator (e.g., the superconducting SAW resonator 102) and a superconducting microwave resonator (e.g., the superconducting microwave resonator 104). The Josephson ring modulator can be a dispersive nonlinear three-wave mixing element.

Figure 5:
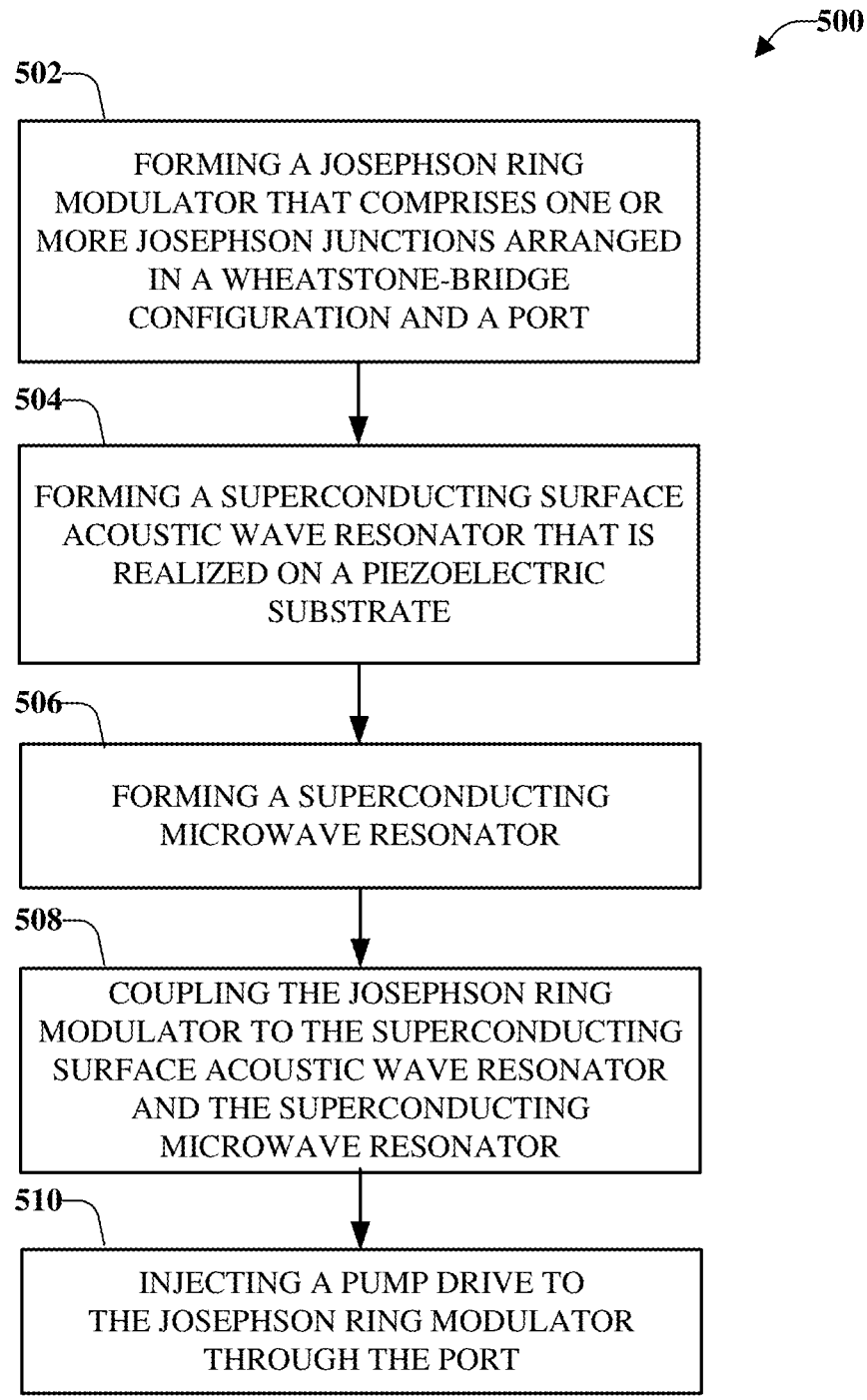
FIG. 5 illustrates a flow diagram of an example, non-limiting, method for fabrication of a device comprising a pump drive port in accordance with one or more embodiments described herein.

FIG. 5 illustrates a flow diagram of an example, non-limiting, method 500 for fabrication of a device comprising a pump drive port in accordance with one or more embodiments described herein. Repetitive description of like elements employed in other embodiments described herein is omitted for sake of brevity.

The method 500 starts at 502, when a Josephson ring modulator (e.g., the JRM 106) is formed. The Josephson ring modulator can comprise one or more Josephson junctions (e.g., the first Josephson junction 108, the second Josephson junction 110, the third Josephson junction 112, the fourth Josephson junction 114) arranged in a Wheatstone-bridge configuration. Further, the Josephson ring modulator can comprise a port, through which a pump drive (e.g., the pump port 218) can be fed.

At 504 of the method 500, a superconducting surface acoustic wave resonator (e.g., the superconducting SAW resonator 102) can be formed. The superconducting surface acoustic wave resonator can be realized on a piezoelectric substrate. A superconducting microwave resonator (e.g., the superconducting microwave resonator 104) can be formed at 506. Further, at 508, the Josephson ring modulator can be coupled to the superconducting surface acoustic wave resonator and the superconducting microwave resonator.

A pump drive can be injected to the Josephson ring modulator through the port, at 510 of the method 500. For example, the pump drive can be fed through a sigma port of a 180-degree hybrid (e.g., the 180-degree hybrid 316). The 180-degree hybrid can be capacitively coupled to opposite nodes of the Josephson ring modulator, which in turn excites a common-mode of the Josephson ring modulator.

Figure 6:
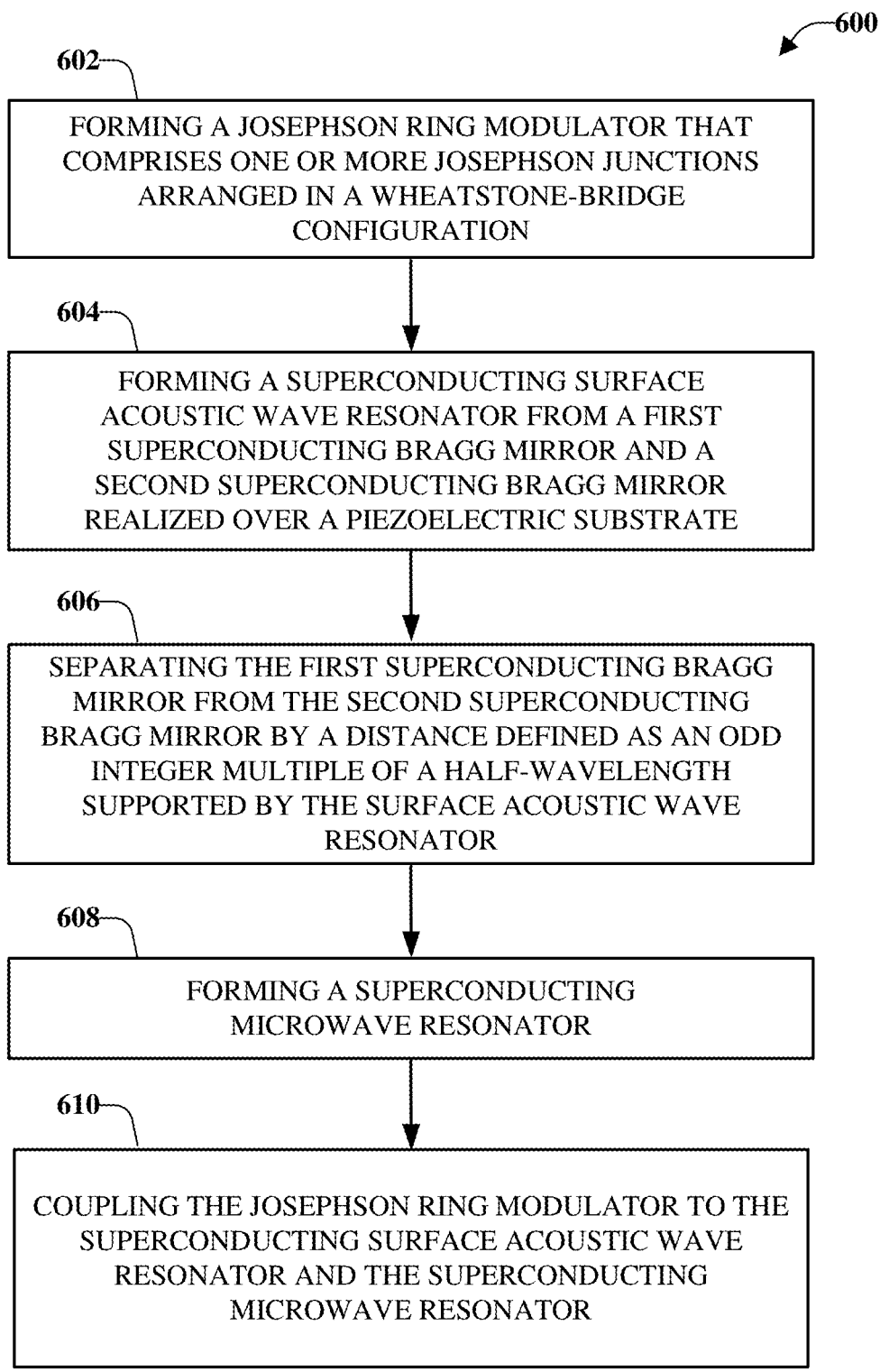
FIG. 6 illustrates a flow diagram of an example, non-limiting, method for fabrication of a device comprising two metallic/dielectric mirrors in accordance with one or more embodiments described herein.

FIG. 6 illustrates a flow diagram of an example, non-limiting, method 600 for fabrication of a device comprising two metallic/dielectric mirrors in accordance with one or more embodiments described herein. Repetitive description of like elements employed in other embodiments described herein is omitted for sake of brevity.

The method 600 starts, at 602, with forming a Josephson ring modulator (e.g., the JRM 106). The Josephson ring modulator can comprise one or more Josephson junctions (e.g., the first Josephson junction 108, the second Josephson junction 110, the third Josephson junction 112, the fourth Josephson junction 114) arranged in a Wheatstone-bridge configuration.

A superconducting surface acoustic wave resonator (e.g. the superconducting SAW resonator 102) can be formed, at 604. The surface acoustic wave resonator can be formed from a first superconducting Bragg mirror (e.g., the first Bragg mirror 202) and a second superconducting Bragg mirror (e.g., the second Bragg mirror 204) realized over a piezoelectric substrate. At 606, the first superconducting Bragg mirror can be separated from the second superconducting Bragg mirror by a distance defined as an odd integer multiple of a half-wavelength of the main mode supported by the surface acoustic wave resonator.

The method 600 can continue, at 608 and a superconducting microwave resonator (e.g., the superconducting microwave resonator 104) can be formed. Further, at 610 of the method 600, the Josephson ring modulator can be coupled to the superconducting surface acoustic wave resonator and the superconducting microwave resonator.

Figure 7:
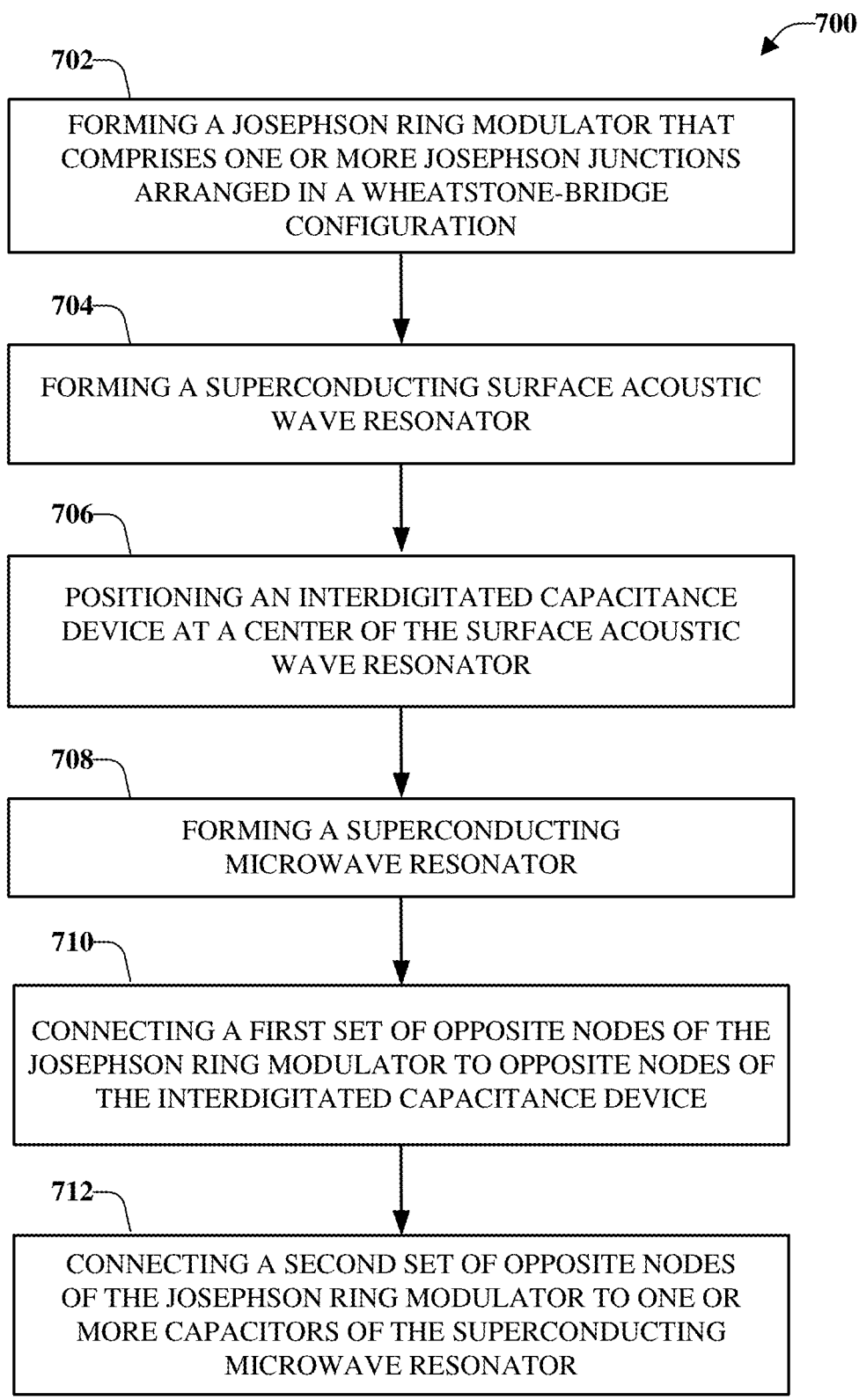
FIG. 7 illustrates a flow diagram of an example, non-limiting, method for fabrication of a device comprising a Josephson ring modulator coupled to a superconducting surface acoustic wave resonator and a superconducting microwave resonator in accordance with one or more embodiments described herein.

FIG. 7 illustrates a flow diagram of an example, non-limiting, method 700 for fabrication of a device comprising a Josephson ring modulator coupled to a superconducting surface acoustic wave resonator and a superconducting microwave resonator in accordance with one or more embodiments described herein. Repetitive description of like elements employed in other embodiments described herein is omitted for sake of brevity.

At 702, a Josephson ring modulator (e.g., the JRM 106) that comprises one or more Josephson junctions (e.g., the first Josephson junction 108, the second Josephson junction 110, the third Josephson junction 112, the fourth Josephson junction 114) can be formed. The one or more Josephson junctions can be arranged in a Wheatstone-bridge configuration.

A superconducting surface acoustic wave resonator (e.g., the superconducting SAW resonator 102) can be formed at 704 of the method 700. The superconducting surface acoustic wave resonator is realized on a low-loss piezo-electric dielectric substrate. For example, the low-loss piezo-electric dielectric substrate can comprise one or more materials selected from a group of materials comprising one or more of quartz, gallium arsenide, lithium niobite, and zinc oxide.

To form the superconducting surface acoustic wave resonator, at 706 of the method 700, an interdigitated capacitance device (e.g., the first IDC 302) can be positioned at a center of the surface acoustic wave resonator. The interdigitated capacitance device can be positioned between two metallic/dielectric Bragg mirrors. For example, the interdigitated capacitance device can be positioned between a first Bragg mirror 202 and a second Bragg mirror 204.

At 708 of the method 700, a superconducting microwave resonator (e.g., the superconducting microwave resonator 104) can be formed. The superconducting microwave resonator can be implemented using lumped-element capacitance and/or lumped-element inductance.

Further, at 710 of the method 700, a first set of opposite nodes (e.g., the first node 124 and the third node 128) of the Josephson ring modulator can be coupled to opposite nodes of the interdigitated capacitance device. For example, one node of the first set of opposite nodes can be coupled to a first electrode of the interdigitated capacitance device (indicated at 304 of FIG. 3). Another node of the first set of opposite nodes can be coupled to a second electrode of the interdigitated capacitance device (indicated at 306 of FIG. 3). It is noted that, according to some implementations, coupling the Josephson ring modulator to opposite nodes of the interdigitated capacitance device (at 710) can occur before forming the superconducting microwave resonator (at 708).

In addition, at 712 of the method 700, a second set of opposite nodes (e.g., the second node 126 and the fourth node 130) of the Josephson ring modulator can be coupled to one or more capacitors (e.g., the first capacitor 308, the second capacitor 310) of the superconducting microwave resonator. For example, one node of the second set of opposite nodes can be connected to a first capacitor of the superconducting microwave resonator. Further, the two nodes of the second set of opposite nodes can be connected to two electrodes of the second capacitor of the superconducting microwave resonator.

Figure 8:
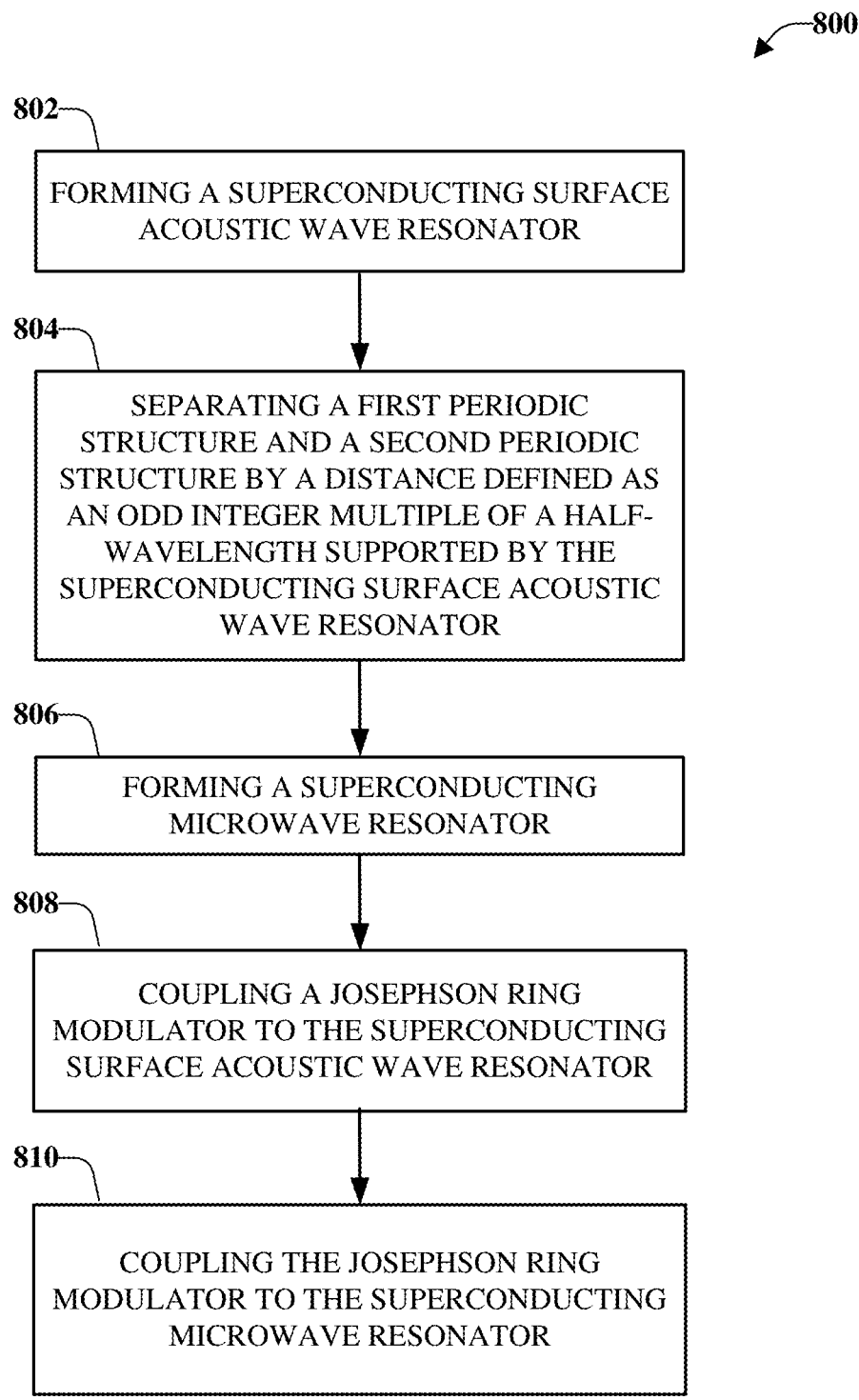
FIG. 8 illustrates a flow diagram of an example, non-limiting, method for fabrication of a superconducting quantum device in accordance with one or more embodiments described herein.

FIG. 8 illustrates a flow diagram of an example, non-limiting, method 800 for fabrication of a superconducting quantum device in accordance with one or more embodiments described herein. Repetitive description of like elements employed in other embodiments described herein is omitted for sake of brevity.

A superconducting surface acoustic wave resonator (e.g., the superconducting SAW resonator 102) can be formed at 802 of the method 800. To form the surface acoustic wave resonator, at 804 of the method, a first periodic structure (e.g., the first Bragg mirror 202) and a second periodic structure (e.g., the second Bragg mirror 204) can be separated by a distance defined as an odd integer multiple of a half-wavelength supported by the superconducting surface acoustic wave resonator. The first periodic structure can comprise first metallic fingers and first dielectric gaps in between the metallic fingers. The second periodic structure can comprise second metallic fingers and second dielectric gaps in between the metallic fingers.

At 806 of the method 800, a superconducting microwave resonator (e.g., the superconducting microwave resonator 104) can be formed. The superconducting microwave resonator can comprise one or more capacitors (e.g., the first capacitor 308 and the second capacitor 310). One capacitor of the one or more capacitors can be a shunting capacitor for the JRM.

Further, a Josephson ring modulator (e.g., the JRM 106) can be coupled to the surface acoustic wave resonator, at 808 of the method. At 810 of the method 800, the superconducting microwave resonator can be coupled to the Josephson ring modulator. According to some implementations, the Josephson ring modulator can comprise one or more Josephson junctions (e.g., the first Josephson junction 108, the second Josephson junction 110, the third Josephson junction 112, the fourth Josephson junction 114) arranged in a Wheatstone-bridge configuration. In some implementations, the Josephson ring modulator can be a dispersive nonlinear three-wave mixing element. It is noted that, according to some implementations, coupling the Josephson ring modulator to the surface acoustic wave resonator (at 810) can occur before forming the superconducting microwave resonator (at 808).

According to some implementations, an interdigitated capacitance device can be positioned at a center of the surface acoustic wave resonator. Further to these implementations, a first set of opposite nodes of the Josephson ring modulator can be connected to opposite nodes of the interdigitated capacitance device. In some implementations, the method can include inducing magnetic flux threading the Josephson ring modulator.

Figure 9:
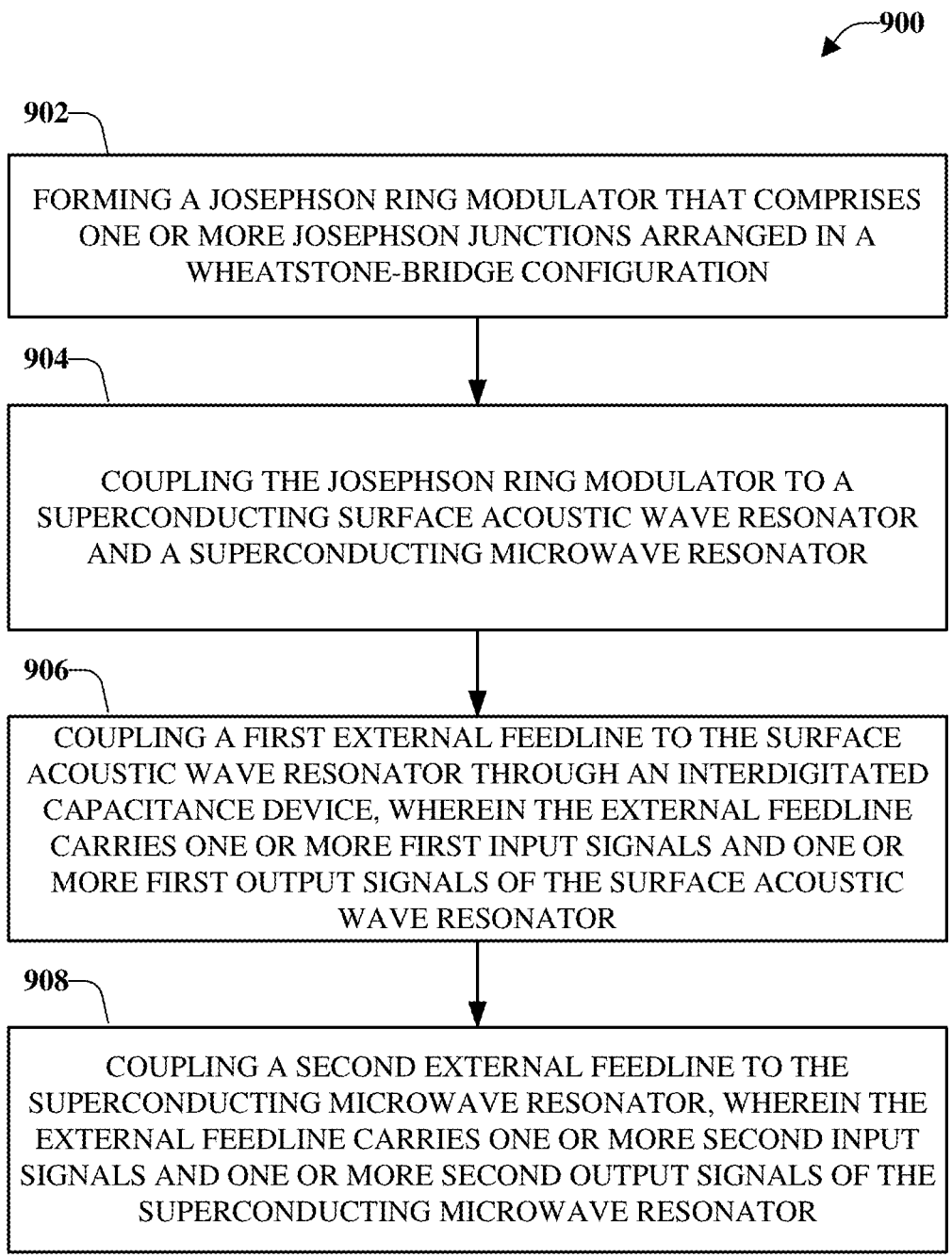
FIG. 9 illustrates a flow diagram of an example, non-limiting, method for fabrication of a superconducting quantum device comprising external feedlines in accordance with one or more embodiments described herein.

FIG. 9 illustrates a flow diagram of an example, non-limiting, method 900 for fabrication of a superconducting quantum device comprising external feedlines in accordance with one or more embodiments described herein. Repetitive description of like elements employed in other embodiments described herein is omitted for sake of brevity.

At 902 of the method 900, a Josephson ring modulator (e.g., the JRM 106) can be formed. The Josephson ring modulator can comprise one or more Josephson junctions (e.g., the first Josephson junction 108, the second Josephson junction 110, the third Josephson junction 112, the fourth Josephson junction 114). The one or more Josephson junctions can be arranged in a Wheatstone-bridge configuration. According to some implementations, the Josephson ring modulator can be a dispersive nonlinear three-wave mixing element.

At 904 of the method 900, the Josephson ring modulator can be coupled to a superconducting surface acoustic wave resonator (e.g., the superconducting SAW resonator 102) and a superconducting microwave resonator (e.g., the superconducting microwave resonator 104).

A first external feedline (e.g., the first external feedline 210) can be coupled to the surface acoustic wave resonator, at 906 of the method 900. For example, the first external feedline can be coupled to the surface acoustic wave resonator through another interdigitated capacitance device. The first external feedline can carry one or more first input signals and one or more first output signals of the surface acoustic wave resonator.

Further, at 908 of the method 900, a second external feedline (e.g., the second external feedline 214) can be coupled to the superconducting microwave resonator. The second external feedline can carry one or more second input signals and one or more second output signals of the superconducting microwave resonator.

In an example, one superconducting SAW resonator (low-frequency) and one superconducting microwave resonator (high-frequency) can be coupled to the JRM. The superconducting SAW resonator can comprise two superconducting Bragg mirrors separated from one another by a distance that is an odd integer multiple of half-wavelength of the main mode supported by the superconducting SAW resonator. The superconducting SAW resonator can be realized on a low-loss piezo-electric dielectric substrate. Further, the JRM can be realized using Al or Nb Josephson junctions.

One pair of opposite nodes of the JRM can be connected to opposite nodes of the IDC. The IDC can be positioned off-center of the SAW resonator (e.g., at a location that does not coincide with a voltage node of the desired coupled mode). The other pair of opposite nodes of the JRM can be connected to a shunt capacitor and, optionally, a shunt inductor. The microwave resonator can be coupled to an external feedline through a coupling capacitor. The external feedline can carry the input and output signals of the microwave resonator. The superconducting SAW resonator can have a separate external feedline which can carry the input and output signals of the SAW resonator. The external feedline can be coupled to the SAW resonator using a designated IDC. The IDC fingers can be located close to rf-voltage antinodes. A pump drive can be injected to the JRM using a separate port. The pump port can be connected to the sigma port of a 180-degree hybrid, which in turn could be capacitively coupled to opposite nodes of the JRM (giving rise to a common excitation of the JRM).

For simplicity of explanation, the methodologies and/or computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Figure 10:
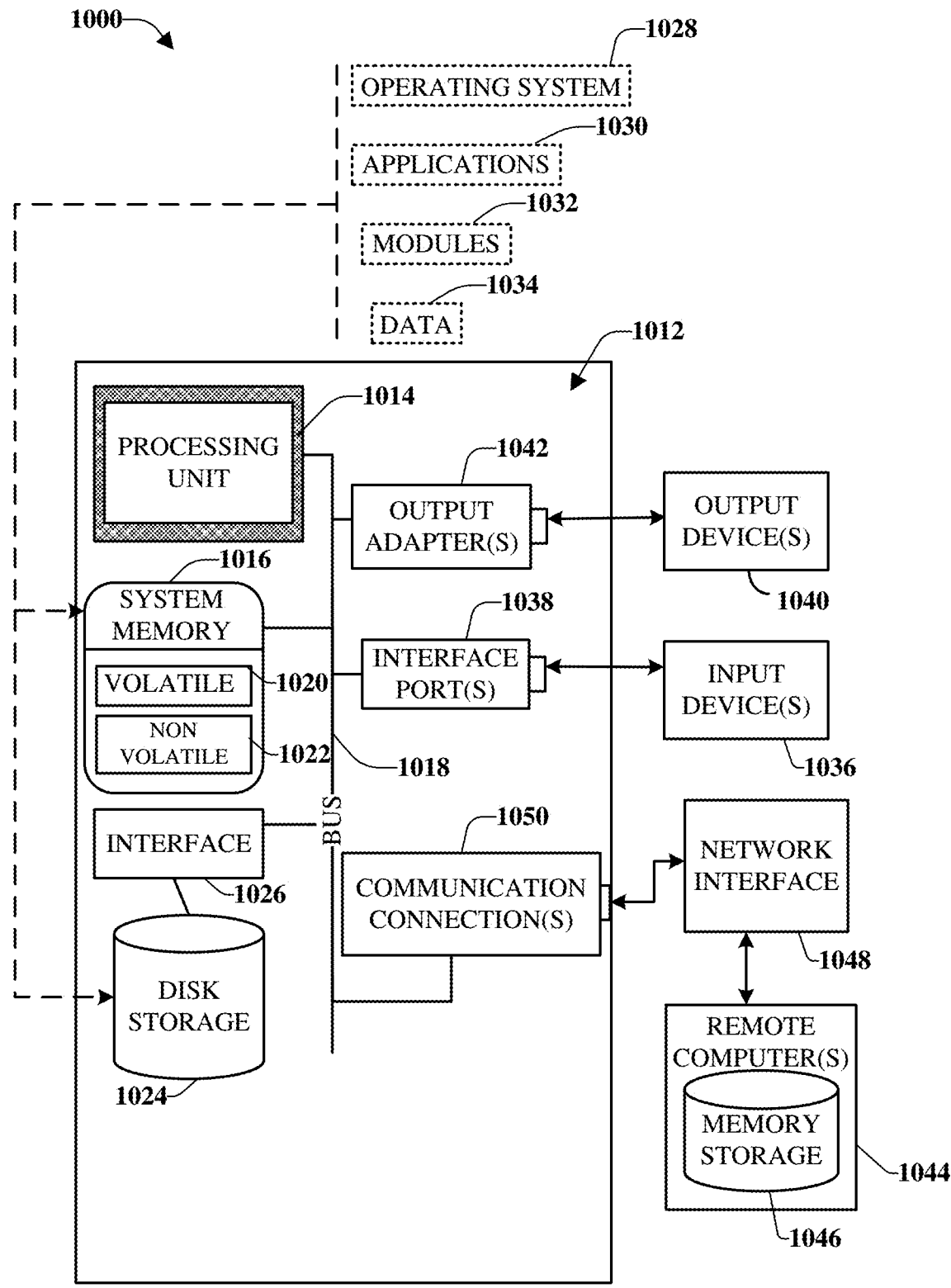
FIG. 10 illustrates a block diagram of an example, non-limiting operating environment in which one or more embodiments described herein can be facilitated.

In order to provide a context for the various aspects of the disclosed subject matter, FIG. 10 as well as the following discussion are intended to provide a general description of a suitable environment in which the various aspects of the disclosed subject matter can be implemented. FIG. 10 illustrates a block diagram of an example, non-limiting operating environment in which one or more embodiments described herein can be facilitated. Repetitive description of like elements employed in other embodiments described herein is omitted for sake of brevity. With reference to FIG. 10, a suitable operating environment 1000 for implementing various aspects of this disclosure can also include a computer 1012. The computer 1012 can also include a processing unit 1014, a system memory 1016, and a system bus 1018. The system bus 1018 couples system components including, but not limited to, the system memory 1016 to the processing unit 1014. The processing unit 1014 can be any of various available processors. Dual microprocessors and other multiprocessor architectures also can be employed as the processing unit 1014. The system bus 1018 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI). The system memory 1016 can also include volatile memory 1020 and nonvolatile memory 1022. The basic input/output system (BIOS), containing the basic routines to transfer information between elements within the computer 1012, such as during start-up, is stored in nonvolatile memory 1022. By way of illustration, and not limitation, nonvolatile memory 1022 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM)). Volatile memory 1020 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 1012 can also include removable/non-removable, volatile/non-volatile computer storage media. FIG. 10 illustrates, for example, a disk storage 1024. Disk storage 1024 can also include, but is not limited to, devices like a magnetic disk drive, floppy disk drive, tape drive, Jaz drive, Zip drive, LS-100 drive, flash memory card, or memory stick. The disk storage 1024 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1024 to the system bus 1018, a removable or non-removable interface is typically used, such as interface 1026. FIG. 10 also depicts software that acts as an intermediary between users and the basic computer resources described in the suitable operating environment 1000. Such software can also include, for example, an operating system 1028. Operating system 1028, which can be stored on disk storage 1024, acts to control and allocate resources of the computer 1012. System applications 1030 take advantage of the management of resources by operating system 1028 through program modules 1032 and program data 1034, e.g., stored either in system memory 1016 or on disk storage 1024. It is to be appreciated that this disclosure can be implemented with various operating systems or combinations of operating systems. A user enters commands or information into the computer 1012 through input device(s) 1036. Input devices 1036 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1014 through the system bus 1018 via interface port(s) 1038. Interface port(s) 1038 include, for example, a serial port, a parallel port, a game port, and a universal serial bus (USB). Output device(s) 1040 use some of the same type of ports as input device(s) 1036. Thus, for example, a USB port can be used to provide input to computer 1012, and to output information from computer 1012 to an output device 1040. Output adapter 1042 is provided to illustrate that there are some output devices 1040 like monitors, speakers, and printers, among other output devices 1040, which require special adapters. The output adapters 1042 include, by way of illustration and not limitation, video and sound cards that provide a method of connection between the output device 1040 and the system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. The remote computer(s) 1044 can be a computer, a server, a router, a network PC, a workstation, a microprocessor based appliance, a peer device or other common network node and the like, and typically can also include many or all of the elements described relative to computer 1012. For purposes of brevity, only a memory storage device 1046 is illustrated with remote computer(s) 1044. Remote computer(s) 1044 is logically connected to computer 1012 through a network interface 1048 and then physically connected via communication connection 1050. Network interface 1048 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1050 refers to the hardware/software employed to connect the network interface 1048 to the system bus 1018. While communication connection 1050 is shown for illustrative clarity inside computer 1012, it can also be external to computer 1012. The hardware/software for connection to the network interface 1048 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create method for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other method to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A superconducting device, comprising:
    a superconducting surface acoustic wave resonator;
    a superconducting microwave resonator; and
    a Josephson ring modulator coupled to the superconducting surface acoustic wave resonator and the superconducting microwave resonator, wherein the Josephson ring modulator is a dispersive nonlinear three-wave mixing element.

2. The superconducting device of claim 1, wherein the superconducting surface acoustic wave resonator comprises:
    a first superconducting Bragg mirror; and
    a second superconducting Bragg mirror separated from the first superconducting Bragg mirror by a distance that is an odd integer multiple of a half-wavelength supported by the superconducting surface acoustic wave resonator.

3. The superconducting device of claim 1, wherein the superconducting surface acoustic wave resonator is realized on a low-loss piezo-electric dielectric substrate that comprises a material selected from a group of materials consisting of quartz, gallium arsenide, lithium niobite, and zinc oxide.

4. The superconducting device of claim 1, wherein the Josephson ring modulator comprises one or more Josephson junctions arranged in a Wheatstone-bridge configuration, and wherein the one or more Josephson junctions comprise a material selected from a group of materials consisting of aluminum and niobium.

5. The superconducting device of claim 1, further comprising:
    an interdigitated capacitance device positioned at a center of the superconducting surface acoustic wave resonator, wherein a first set of opposite nodes of the Josephson ring modulator are connected to opposite nodes of the interdigitated capacitance device.

6. The superconducting device of claim 5, wherein a second set of opposite nodes of the Josephson ring modulator are connected to a shunt capacitor.

7. The superconducting device of claim 1, further comprising:
    a first external feedline coupled to the superconducting surface acoustic wave resonator through an interdigitated capacitance device, wherein the first external feedline carries one or more first input signals and one or more first output signals of the superconducting surface acoustic wave resonator; and
    a second external feedline coupled to the superconducting microwave resonator, wherein the second external feedline carries one or more second input signals and one or more second output signals of the superconducting microwave resonator.

8. The superconducting device of claim 1, wherein induced magnetic flux threads the Josephson ring modulator.

9. The superconducting device of claim 1, wherein the Josephson ring modulator comprises a port, wherein a pump drive is injected to the Josephson ring modulator through the port.

10. A superconducting circuit, comprising:
    a superconducting surface acoustic wave resonator;
    a Josephson ring modulator coupled to the superconducting surface acoustic wave resonator; and
    a superconducting microwave resonator coupled to the Josephson ring modulator, wherein the Josephson ring modulator is a dispersive nonlinear three-wave mixing element, and wherein the superconducting surface acoustic wave resonator is realized on a low-loss piezo-electric dielectric substrate.

11. The superconducting circuit of claim 10, wherein the superconducting surface acoustic wave resonator comprises:
    a first superconducting Bragg mirror and a second superconducting Bragg mirror separated by a distance that is an odd integer multiple of a half-wavelength supported by the superconducting surface acoustic wave resonator.

12. The superconducting circuit of claim 10, wherein the Josephson ring modulator comprises one or more Josephson junctions that comprise a material selected from a group of materials consisting of aluminum and niobium.

13. The superconducting circuit of claim 10, further comprising:
an interdigitated capacitance device positioned at a center of the superconducting surface acoustic wave resonator, wherein a first set of opposite nodes of the Josephson ring modulator are connected to opposite nodes of the interdigitated capacitance device, and wherein a second set of opposite nodes of the Josephson ring modulator are connected to a shunt capacitor, wherein the interdigitated capacitance device, the shunt capacitor, and the Josephson ring modulator form the superconducting microwave resonator.

14. The superconducting circuit of claim 10, further comprising:
a first external feedline coupled to the superconducting surface acoustic wave resonator through an interdigitated capacitance device, wherein the first external feedline carries one or more first input signals and one or more first output signals of the superconducting surface acoustic wave resonator; and
a second external feedline coupled to the superconducting microwave resonator, wherein the second external feedline carries one or more second input signals and one or more second output signals of the superconducting microwave resonator.

15. A method, comprising:
forming a Josephson ring modulator that comprises one or more Josephson junctions arranged in a Wheatstone-bridge configuration; and
coupling the Josephson ring modulator to a superconducting surface acoustic wave resonator and a superconducting microwave resonator, wherein the Josephson ring modulator is a dispersive nonlinear three-wave mixing element.

16. The method of claim 15, further comprising:
forming the superconducting surface acoustic wave resonator from a first superconducting Bragg mirror and a second superconducting Bragg mirror; and
separating the first superconducting Bragg mirror from the second superconducting Bragg mirror by a distance defined as an odd integer multiple of a half-wavelength supported by the superconducting surface acoustic wave resonator.

17. The method of claim 15, wherein the one or more Josephson junctions comprise a first material selected from a first group of materials consisting of aluminum and niobium, the method further comprising:
realizing the superconducting surface acoustic wave resonator on a low-loss piezo-electric dielectric substrate, wherein the low-loss piezo-electric dielectric substrate comprises a second material selected from a second group of materials consisting of quartz, gallium arsenide, lithium niobite, and zinc oxide.

18. The method of claim 15, further comprising:
positioning an interdigitated capacitance device at a center of the superconducting surface acoustic wave resonator;
connecting a first set of opposite nodes of the Josephson ring modulator to opposite nodes of the interdigitated capacitance device; and
connecting a second set of opposite nodes of the Josephson ring modulator to one or more capacitors of the superconducting microwave resonator.

19. The method of claim 15, further comprising:
inducing magnetic flux threading the Josephson ring modulator.

* * * * *